(12) United States Patent
Kameyama et al.

(10) Patent No.: US 7,815,972 B2
(45) Date of Patent: Oct. 19, 2010

(54) METHOD FOR MANUFACTURING POLARIZING FILM AND POLARIZING FILM AND OPTICAL FILM MANUFACTURED BY USING THE METHOD

(75) Inventors: Tadayuki Kameyama, Ibaraki (JP); Youichirou Sugino, Ibaraki (JP); Hiroaki Mizushima, Ibaraki (JP); Morimasa Wada, Ibaraki (JP); Naoki Tomoguchi, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 589 days.

(21) Appl. No.: 10/522,618

(22) PCT Filed: Aug. 1, 2003

(86) PCT No.: PCT/JP03/09781

§ 371 (c)(1),
(2), (4) Date: Jan. 31, 2005

(87) PCT Pub. No.: WO2004/013667

PCT Pub. Date: Feb. 12, 2004

(65) Prior Publication Data

US 2005/0271873 A1 Dec. 8, 2005

(30) Foreign Application Priority Data

Aug. 2, 2002 (JP) .............................. 2002-225551

(51) Int. Cl.
*B05D 3/10* (2006.01)
(52) U.S. Cl. ...................................... 427/307
(58) Field of Classification Search .................. 427/307
See application file for complete search history.

(56) References Cited

U.S. PATENT DOCUMENTS 3,492,185 A * 1/1970 Burger ........................ 156/425
5,071,906 A * 12/1991 Tanaka et al. ............... 524/557

(Continued)

FOREIGN PATENT DOCUMENTS

EP 1 160 591 12/2001

(Continued)

OTHER PUBLICATIONS

Office Action mailed Jul. 31, 2008 in Corresponding Japanese Patent Application No. 2003-284411.

*Primary Examiner*—Michael Cleveland
*Assistant Examiner*—Nathan H Empie
(74) *Attorney, Agent, or Firm*—Westerman, Hattori, Daniels & Adrian, LLP

(57) ABSTRACT

A polarizing film is provided that prevents display unevenness and can form a liquid crystal display and an electroluminescence display that exhibit excellent display characteristics. The polarizing film is produced in the following manner. That is, a hydrophilic polymer film is conveyed by means of a guide roll so as to be impregnated in an aqueous solvent in a swelling bath and is allowed to swell. In this swelling step, at least a first guide roll is arranged in the swelling bath, and when the polymer film is impregnated in and allowed to travel in the aqueous solvent, the polymer film is brought into contact with the first guide roll within a time up to when swelling reaches a saturation state. Further, the polymer film is dyed using a dichroic substance and stretched.

14 Claims, 6 Drawing Sheets

U.S. PATENT DOCUMENTS

| | | |
|---|---|---|
| 6,833,099 B2 | 12/2004 | Senefuji et al. |
| 2001/0024322 A1* | 9/2001 | Harita et al. ............... 359/490 |
| 2002/0001700 A1* | 1/2002 | Sanefuji et al. ............ 428/220 |

FOREIGN PATENT DOCUMENTS

| | | | |
|---|---|---|---|
| JP | 10-153709 | | 6/1998 |
| JP | 10153709 A | * | 6/1998 |
| JP | 2000-147251 A | | 5/2000 |
| JP | 2000147252 A | * | 5/2000 |
| JP | 2001-141926 A | | 5/2001 |
| JP | 2001-343529 | | 12/2001 |
| JP | 2002-28939 | | 1/2002 |
| JP | 2002-31720 | | 1/2002 |
| JP | 2002-105348 A | | 4/2002 |
| JP | 2002-166437 A | | 6/2002 |
| JP | 2002-328233 | | 11/2002 |

* cited by examiner

METHOD FOR MANUFACTURING POLARIZING FILM AND POLARIZING FILM AND OPTICAL FILM MANUFACTURED BY USING THE METHOD

TECHNICAL FIELD

The present invention relates to a method of producing a polarizing film, a polarizing film produced by the method and an optical film.

BACKGROUND ART

Liquid crystal displays (LCDs) have been used widely, for example, for desk calculators, electronic clocks, personal computers, word processors, and instruments of automobiles and machines. Generally, such a liquid crystal display includes a polarizing plate for visualizing a variation in orientation of its liquid crystal, and the polarizing plate has an extremely large influence on display characteristics of the liquid crystal display.

As the polarizing plate, for example, a laminate formed in the following manner is used commonly. That is, a polarizer (polarizing film) such as a polyvinyl alcohol (PVA)-based film or the like is made to absorb a dichroic substance such as iodine, an organic dyestuff or the like and is aligned, and a protective film made from triacetylcellulose or the like is laminated on each surface of the polarizer. Particularly, there has been a demand for a polarizer that allows a liquid crystal display to have high brightness, good color reproducibility and excellent display characteristics.

However, in the liquid crystal display, particularly, in the case of using a backlight that emits polarized light, display unevenness occurs to decrease contrast uniformity, which has been disadvantageous. Particularly, in an image display, the achievement of high contrast entails a considerable degree of such display unevenness. For example, in the case where a normally black mode (in which a black display state is established in a state where no voltage is applied) is established as a liquid crystal mode, a considerable degree of display unevenness is observed in the view from an oblique direction at an angle of at least 30°, 40° and 60°.

Meanwhile, a polarizer is produced generally by the following method. That is, a hydrophilic polymer film is conveyed by means of a guide roll so as to be impregnated in a swelling bath for swelling, then is impregnated in a dyebath containing a dichroic substance for dyeing, and further is stretched while being impregnated in a crosslinking bath. Previously, for example, JP2002-28939 A and JP2002-31720 A have disclosed as the hydrophilic polymer film PVA films having improved thickness uniformity. However, even when such a film is used, there is a possibility that a polarizer as a finished product has a variation in retardation and a variation in the content of a dichroic substance.

DISCLOSURE OF THE INVENTION

For the reasons described above, the object of the present invention is to provide a polarizing film for use in various types of displays that further prevents the occurrence of display unevenness and exhibits uniform display characteristics.

In order to achieve the above-mentioned object, as a method of producing a polarizing film according to the present invention, first and second production methods are provided as follows.

That is, the first production method according to the present invention is a method of producing a polarizing film comprising the steps of: allowing a hydrophilic polymer film to swell wherein the polymer film is conveyed by means of a guide roll so as to be impregnated in an aqueous solvent in a swelling bath; dyeing the polymer film using a dichroic substance; and stretching the polymer film. In the method, in the swelling step, at least one guide roll (first guide roll) is arranged in the swelling bath, and when the polymer film is impregnated in and allowed to travel in the aqueous solvent, the polymer film is brought into contact with the guide roll (first guide roll) within a time up to when swelling reaches a saturation state.

Furthermore, the second production method according to the present invention is a method of producing a polarizing film comprising the steps of: allowing a hydrophilic polymer film to swell in an aqueous solvent, in which the film is conveyed by means of a guide roll so as to be impregnated in a swelling bath of the aqueous solvent; dyeing the film using a dichroic substance; and stretching the film. In the method, in the swelling step, at least one guide roll (first guide roll) is arranged in the swelling bath, and when the film is impregnated in and allowed to travel in the aqueous solvent, the film is brought into contact with the guide roll (first guide roll) after swelling reaches a saturation state.

In order to achieve the above-mentioned object, the inventors of the present invention conducted a vigorous study on the production of a polarizing film. The study led them to the following findings. That is, when a polyvinyl alcohol (PVA) film that is a hydrophilic polymer film is impregnated in an aqueous solvent in a swelling bath, generally, swelling occurs abruptly within 15 seconds to 25 seconds. If the PVA film is brought into contact with a guide roll at that point in time, wrinkles may be formed in the film on the surface of the guide roll. This causes the PVA film to have a variation in retardation and further to have a variation in the content of a dichroic substance. The inventors found that the above-mentioned problems, i.e. a variation in retardation and a variation in the content of a dichroic substance could be reduced in the following manner. That is, a point in time at which the polymer film is brought into contact with the guide roll is controlled according to the swollen state of the polymer film. Specifically, a length of time between the time when the hydrophilic polymer film is brought into contact with the aqueous solvent in the swelling bath and the time when the polymer film is bought into contact with the guide roll in the swelling bath is controlled. The inventors thus arrived at the above-described first and second methods of producing a polarizing film. Further, conceivably, the formation of wrinkles is attributable to slack caused by a phenomenon in which, in the swelling step, a thin portion of a polymer film is stretched by swelling to a greater degree than in other portions thereof. Conventionally, this problem has been solved by performing a stretching treatment. However, when wrinkles are smoothed by the stretching treatment, for example, there are possibilities that a dichroic substance is absorbed in a less amount, and that the dichroic substance is desorbed in a later step (for example, a crosslinking step). This may result in the occurrence of a considerable degree of dyeing unevenness, which has been disadvantageous. On the other hand, according to the method of the present invention, instead of performing a stretching treatment in order to smooth wrinkles, the formation of wrinkles itself is reduced, and thus the conventional problems also can be avoided. Incidentally, the inventors of the present invention were the first to determine that the relationship between a film and a guide roll exerts a large influence on the formation of wrinkles and dyeing unevenness of a polarizing film to be produced.

According to the above-described first and second production methods of the present invention, in a polarizing film to be obtained, a variation in retardation and a variation in the content of a dichroic substance are suppressed. Therefore, when applied to, for example, various types of image displays such as a liquid crystal display and the like, particularly, large-sized or high-contrast displays, and flat panel displays, the polarizing film has the effect that display unevenness (particularly, display unevenness in black display) can be eliminated sufficiently.

BEST MODE FOR CARRYING OUT THE INVENTION

Figure 1:
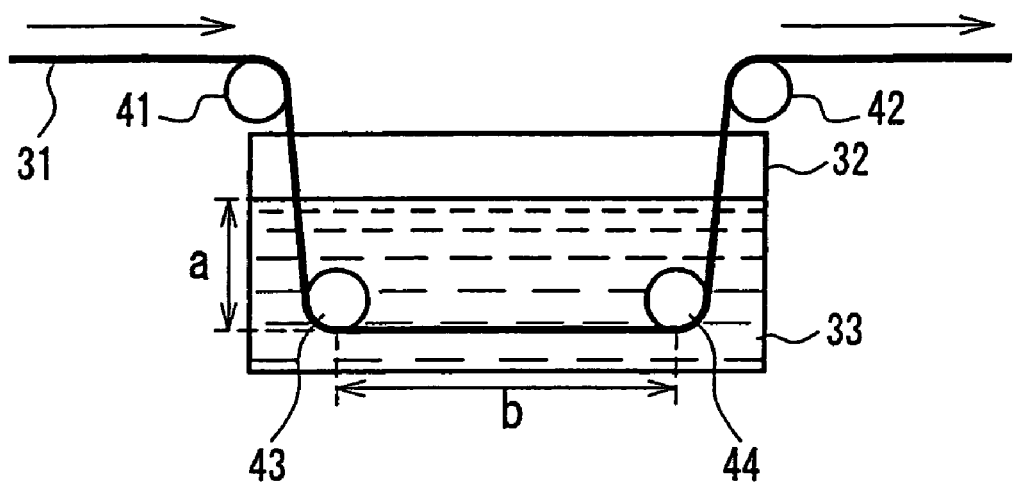
FIG. 1 is a schematic diagram showing an example of a swelling step in a method of producing an optical film according to the present invention.

The description is directed first to the first production method according to the present invention. As described above, the first production method according to the present invention is a method of producing a polarizing film comprising the steps of: allowing a hydrophilic polymer film to swell wherein the polymer film is conveyed by means of a guide roll so as to be impregnated in an aqueous solvent in a swelling bath; dyeing the polymer film using a dichroic substance; and stretching the polymer film. In the method, in the swelling step, at least a first guide roll is arranged in the swelling bath, and when the polymer film is impregnated in and allowed to travel in the aqueous solvent, the polymer film is brought into contact with the first guide roll within a time up to when swelling reaches a saturation state. Further, preferably, the polymer film is brought into contact with the first guide roll within a time up to when swelling of the polymer film reaches saturation and before the swelling occurs abruptly.

In the first production method according to the present invention, it is only required that the polymer film is brought into contact with the first guide roll within a time up to when swelling reaches saturation. There is no particular limitation on a required length of time (a) between the time when the polymer film is brought into contact with the aqueous solvent and the time when the polymer film is brought into contact with the first guide roll, and also can be determined appropriately according to, for example, the temperature for the swelling bath. Specifically, it is preferable that the required length of time (a) is 0.6 seconds to 12 seconds for the following reason. That is, generally, swelling of a polymer film occurs abruptly within 15 seconds to 25 seconds as described above, and thus in the case where the required length of time (a) is 0.6 to 12 seconds, after the polymer film is brought into contact with the first guide roll, swelling of the polymer film occurs abruptly and reaches saturation, so that the formation of wrinkles is suppressed. Thus, in a polarizing film as a finished product, a variation in retardation and a variation in the content of a dichroic substance can be suppressed. The required length of time (a) is in the range of, preferably, 1.2 seconds to 9 seconds, and more preferably, 2.5 seconds to 7 seconds.

Furthermore, the required length of time (a) can be determined appropriately according to, for example, the temperature for a swelling bath. It is particularly preferable that the required length of time (a) is in the range of 2.5 to 4 seconds when the temperature for the swelling bath is 40° C. to 50° C., in the range of 2.5 to 6 seconds when the temperature is 30° C. to lower than 40° C., and in the range of 2.5 to 7 seconds when the temperature is 15° C. to lower than 30° C.

In the first production method according to the present invention, preferably, in the case where a second guide roll further is arranged in the swelling bath, the polymer film is brought into contact with the first guide roll within a time up to when swelling reaches saturation and further is brought into contact with the second guide roll after the swelling reaches saturation for the following reason. That is, in this manner, for example, the formation of wrinkles attributable to the polymer film being brought into contact with the first guide roll can be suppressed, and after being brought into contact with the first guide roll, the polymer film is allowed to swell to saturation, thereby receiving no influence even when brought into contact next with the second guide roll. When the polymer film is brought into contact with the second guide roll, it is not necessarily required that swelling of the polymer film have reached a saturation state as long as the swelling has already occurred abruptly.

A required length of time (b) between the time when an arbitrary point on the polymer film is brought into contact with the first guide roll and the time when the point is brought into contact with the second guide roll is in the range of, for example, preferably 13 seconds to 120 seconds, more preferably 20 to 100 seconds, and particularly preferably 33 seconds to 80 seconds. Further, a total length of time of the required length of time (a) and the required length of time (b) is, for example, preferably in the range of 25 to 180 seconds, more preferably 30 to 160 seconds, and particularly preferably 40 to 140 seconds.

Furthermore, similarly to the required length of time (a), the required length of time (b) can be determined appropriately also according to the temperature for a swelling bath. It is particularly preferable that the required length of time (b) is in the range of 15 to 80 seconds when the temperature for the swelling bath is 40° C. to 50° C., in the range of 20 to 85 seconds when the temperature is 30° C. to lower than 40° C., and in the range of 25 to 90 seconds when the temperature is 15° C. to lower than 30° C.

FIG. 1 is a diagrammatic view showing an example of a swelling step in the first production method according to the present invention. As shown in the figure, two guide rolls 41 and 42 are arranged externally to a swelling bath 32, and two guide rolls 43 and 44 are arranged inside the swelling bath 32. The swelling bath 32 is filled with an aqueous solvent 33. The guide rolls are arranged in order along the traveling direction of a polymer film (direction indicated by an arrow in the figure), and, among the guide rolls arranged in the swelling bath 32, the one arranged upstream in the traveling direction of the polymer film serves as the first guide roll 43, and the other serves as the second guide roll 44. When a polymer film 31 is conveyed by means of the guide rolls, the length between a part of the polymer film 31 that is brought into contact with the aqueous solvent (namely, the surface of the aqueous solvent) and a part of the polymer film 31 that is brought into contact with the first guide roll 43 is defined as a length [a], and the time required for an arbitrary point on the polymer film 31 to travel the length a is defined as a required length of time (a). Further, the length between the part of the polymer film 31 that is brought into contact with the first guide roll 43 and a part of the polymer film 31 that is brought into contact with the second guide roll 44 is defined as a length [b], and the time required for an arbitrary point on the polymer film 31 to travel the length b is defined as a required length of time (b). There is no particular limitation on the number of guide rolls to be arranged, and an additional guide roll further may be arranged inside or externally to a swelling bath as required.

In the case of using the above-mentioned swelling bath, firstly, the polymer film 31 is conveyed by means of the guide rolls from the outside of the swelling bath 32 (the left side in the figure) into the swelling bath so as to be impregnated in the aqueous solvent 33. Then, within a time up to when swelling of the polymer film 31 reaches saturation, the polymer film 31 is allowed to travel the length [a], and within a time up to when the polymer film 31 traveling from the first guide roll 43 reaches the second guide roll 44, the polymer film 31 is allowed to swell to saturation. As for the required length of time (a) and the required length of time (b), reference should be made to the above description.

The length a between a part of the polymer film that is brought into contact with the aqueous solvent 33 in the swelling bath 32 and a part of the polymer film that is brought into contact with the first guide roll 43 is not particularly limited, and is in the range of, for example, 4 to 2,400 mm. The length [b] between a part of the polymer film 31 that is brought into contact with the first guide roll 43 and a part of the polymer film 31 that is brought into contact with the second guide roll 44, namely, the distance between the first guide roll 43 and the second guide roll 44 is not particularly limited, and is in the range of, for example, 80 to 36,000 mm. Further, the speed at which the film is conveyed is, for example, 6 to 200 mm/sec.

There is no particular limitation on the type of the guide rolls, and conventionally known types of guide rolls can be used. Examples of such guide rolls are shown schematically in FIG. 3. In the figure, (a) shows a flat roll with a surface having no unevenness, (b) shows a crown roll that is effective in smoothing wrinkles, (c) shows an expander roll, (d) shows a roll with lugs, and (e) shows a spiral roll. Alternatively, a bent roll and the like also can be used. Among these, as also described in JP2000-147252A, preferably, a spiral roll is used as a guide roll other than the first guide roll because of the possibility of leaving depressions on a hydrophilic polymer film (this also applies to the second production method). Further, the guide rolls preferably exhibit the effect of smoothing wrinkles, and preferably, the effect is such that the film is not stretched in a lateral direction to a degree greater than the degree to which the film is stretched by swelling in a width direction. Specifically, assuming that the length in the width direction of the film after being stretched by swelling is defined to be 100%, the rate at which the film further is stretched by the guide rolls is, for example, preferably 20% or lower, more preferably 10% or lower, and still more preferable 5% or lower.

The material for the above-mentioned types of rolls is not particularly limited and can be, for example, metal or a polymer. However, preferably, an expander roll, at least a lug portion of a roll with lugs, and a spiral roll are formed from, for example, a material having surface energy almost equivalent to surface energy of the film being treated in the swelling bath.

The description is directed next to the second production method according to the present invention. As described above, the second production method according to the present invention is a method of producing a polarizing film comprising the steps of: allowing a hydrophilic polymer film to swell in an aqueous solvent, in which the film is conveyed by means of a guide roll so as to be impregnated in a swelling bath of the aqueous solvent; dyeing the film using a dichroic substance; and stretching the film. In the method, in the swelling step, at least a first guide roll is arranged in the swelling bath, and when the film is impregnated in and allowed to travel in the aqueous solvent, the film is brought into contact with the first guide roll after swelling reaches saturation.

In the second production method according to the present invention, it is only required that the polymer film can be brought into contact with the first guide roll after swelling reaches saturation. There is no particular limitation on a required length of time (c) between the time when an arbitrary point on the film is brought into contact with the aqueous solvent and the time when the point is brought into contact with the first guide roll. It is preferable that the required length of time (c) is, for example, 25 to 180 seconds for the following reason. That is, generally, swelling of a polymer film occurs abruptly within 15 to 25 seconds as described above, and thus in the case where the required length of time (c) is not shorter than 25 seconds, before the polymer film is brought into contact with the first guide roll, swelling of the polymer film reaches saturation, so that the formation of wrinkles is suppressed. On the other hand, in the case where the required length of time (c) is not longer than 180 seconds, the occurrence of slack in the polymer film further is prevented, thereby allowing the film to be conveyed more stably. Consequently, in a polarizing film to be produced, a variation in retardation and a variation in the content of a dichroic substance further can be suppressed. The required length of time (c) is in the range of, preferably 30 seconds to 160 seconds, and more preferably 40 seconds to 140 seconds. In the second production method, when the polymer film is bought into contact with the first guide roll, it is not necessarily required that swelling has reached a saturation state as long as the swelling has already occurred abruptly.

Furthermore, similarly to the required lengths of time (a) and (b), the required length of time (c) can be determined appropriately also according to the temperature for a swelling bath. It is particularly preferable that the required length of time (c) is in the range of 40 to 140 seconds when the temperature for the swelling bath is 40° C. to 50° C., in the range of 45 to 140 seconds when the temperature is 30° C. to lower than 40° C., and in the range of 50 to 140 seconds when the temperature is 15° C. to lower than 30° C.

Figure 2:
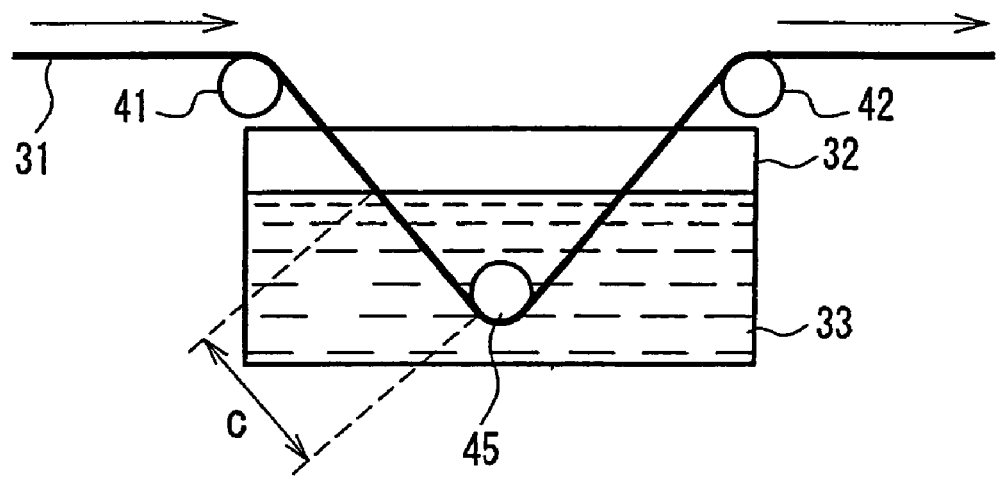
FIG. 2 is a schematic diagram showing another example of the swelling step in the method of producing an optical film according to the present invention.
Figure 3A:
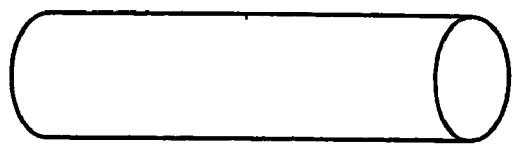
FIG. 3 is a schematic diagram showing examples of a guide roll that is used in the production method according to the present invention.
Figure 3B:
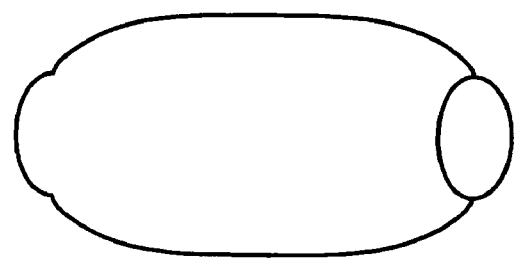
Figure 3C:
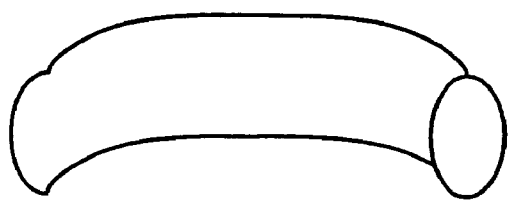
Figure 3D:
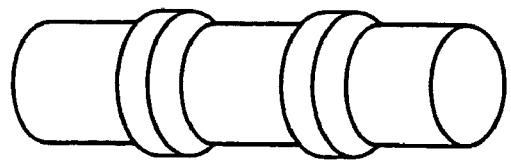
Figure 3E:

FIG. 2 is a diagrammatic view showing an example of a swelling step in the second production method according to the present invention. As shown in the figure, two guide rolls 41 and 42 are arranged externally to a swelling bath 32, and one guide roll (first guide roll) 45 is arranged inside the swelling bath 32. The swelling bath 32 is filled with an aqueous solvent 33. The guide rolls are arranged in order toward the traveling direction of a polymer film (direction indicated by an arrow in the figure). When a polymer film 31 is conveyed by means of the guide rolls, the length between a part of the polymer film 31 that is brought into contact with the aqueous solvent 33 and a part of the polymer film 31 that is brought into contact with the first guide roll 45 is defined as a length [c], and the time required for an arbitrary point on the polymer film to travel the length c is defined as a required length of time (c). There is no particular limitation on the number of guide rolls to be arranged, and an additional guide roll further may be arranged inside or externally to a swelling bath as required.

In the case of using the above-mentioned swelling bath, firstly, the polymer film 31 is conveyed by means of the guide rolls from the outside of the swelling bath 32 (the left side in the figure) into the swelling bath so as to be impregnated in the aqueous solvent 33. Then, the polymer film 31 is allowed to swell while traveling, and within a time up to when the polymer film 31 reaches the first guide roll 45, the polymer film 31 is allowed to swell to a saturation state. As for the required length of time (c), reference should be made to the above description.

The length [c] a between a part of the polymer film that is brought into contact with the aqueous solvent in the swelling bath 32 and a part of the polymer film that is brought into contact with the first guide roll is not particularly limited, and is in the range of, for example, 150 to 36,000 mm. Further, the speed at which the film is conveyed is, for example, 6 to 200 mm/sec.

Next, the description is directed to an example of a sequence of production steps in the first and second production methods according to the present invention. Specifically, under the above-described conditions, a hydrophilic polymer film is allowed to swell and is dyed using a dichroic substance in a dyebath. The hydrophilic polymer film further is stretched in a crosslinking bath, washed with water and dried, and thus a polarizing film (polarizer) is obtained.

(1) Hydrophilic Polymer Film

There is no particular limitation on the hydrophilic polymer film, and conventionally known hydrophilic polymer films can be used. Examples of the hydrophilic polymer film include a PVA-based film, a partially formalized PVA-based film, a polyethylene terephthalate (PET)-based film, a film based on ethylene-vinyl acetate copolymer, and partially-saponified films thereof. Further, alternatively, polyene aligned films of dehydrated PVA, dehydrochlorinated polyvinyl chloride and the like, stretch-aligned polyvinylene-based films and the like also can be used. Among these, a PVA-based polymer film is preferable, as it has an excellent dye-affinity provided by iodine as the above-mentioned dichroic substance. Hereinafter, the length of a polymer film in a stretching direction is referred to as a "length" and the length thereof in a direction perpendicular to the stretching direction is referred to as a "width".

Although not particularly limited, an average degree of polymerization of the PVA film is, preferably in the range of 100 to 5,000, and more preferably 1,000 to 4,000 in light of the water solubility of the film. Further, a saponification degree is, for example, preferably not lower than 75 mol %, and more preferably 98 to 100 mol %.

There is no particular limitation on the thickness of the polymer film, and the thickness is, for example, not more than 110 µm, preferably in the range of 38 to 110 µm, more preferably 50 to 100 µm, and particularly preferably 60 to 80 µm for the following reason. That is, with the thickness being not more than 110 µm, in the case where a polarizer as a finished product is mounted in an image display, the color change of a display panel can be suppressed sufficiently, and with the thickness being in the range of 60 to 80 µm, a stretching treatment further can be facilitated.

Preferably, in order to suppress, for example, a variation in retardation and a variation in the content of a dichroic substance in a polarizing film to be produced, for example, the polymer film contains a plastic material. There is no particular limitation on the content of a plastic material in the polymer film as long as it allows the effects of the present invention to be attained. It is preferable that with respect to a total amount (100% by mass) of the film, the plastic material is contained in an amount of, for example, 1 to 17% by mass. With the content of the plastic material being in the above-mentioned range, sufficient handling ease of a polymer film can be obtained, the occurrence of rupture further can be prevented, and an influence on the formation of the film also can be avoided sufficiently.

There is no particular limitation on the plastic material as long as it can plasticize the polymer film, and conventionally known plastic materials can be used. Specifically, it is preferable to use a water-soluble plastic material, and examples thereof include glycols such as ethylene glycol, diethylene glycol, propylene glycol, a low-molecular-weight polyethylene glycol (Mw: 200 to 400) and the like; glycerin derivatives such as glycerin, diglycerin, triglycerin and the like. Among these, glycerin derivatives are preferable because of their strong interaction with PVA and high compatibility, and glycerin is particularly preferable. In the case where a PVA film is used as the polymer film and glycerin is used as the water-soluble plastic material as described above, the content of the glycerin with respect to the total amount (100% by mass) of the film is, preferably 3 to 16% by mass, and more preferably in the range of 5 to 15% by mass.

Preferably, the polymer film is formed of, for example a film that allows uneven swelling to be prevented from occurring in a subsequent step that is a swelling step, namely a film in which a variation in thickness due to swelling hardly occurs for the following reason. That is, by the use of such a film, in a polarizer to be produced, variations in retardation, the content of a dichroic substance, transmittance and the like further can be reduced. Thus, it is preferable to use a polymer film in which, for example, a variation in crystallinity, a variation in thickness, a variation in moisture percentage are prevented. Further, it also is preferable to use a polymer film in which a variation in the content of glycerin is prevented. Even in a film having a variation in thickness, since the degree of swelling is greater in a relatively thin part and smaller in a relatively thick part, by sufficient swelling, it also is possible to reduce the problem of a variation in thickness.

(2) Swelling Treatment

The polymer film is subjected to a swelling treatment in which the polymer film is impregnated in a swelling bath, and allowed to travel in the swelling bath so as to satisfy the above-mentioned conditions. Preferably, in this swelling step, for example, while being allowed to swell, the polymer film is subjected to a stretching treatment for the following reason. That is, by the stretching treatment, swelling further progresses, and even in the case where a few wrinkles are formed on a guide roll, such wrinkles can be smoothed.

Examples of an aqueous solvent for the swelling bath include aqueous solutions for a swelling treatment containing water, acid, alkali, an electrolyte and the like. There is no particular limitation on the type and concentration of the acid, alkali, and electrolyte as long as they exert no influence on a variation in retardation and a variation in the content of a dichroic substance in a polarizer to be produced, and conventionally known types of acid, alkali, and an electrolyte can be used. Specifically, for example, electrolytes such as potassium, sodium and the like and glycerin are used. Particularly, in the case where a PVA film is used as the polymer film, it is preferable that glycerin is contained.

Preferably, the temperature of the aqueous solvent in the swelling bath is, for example, 15 to 50° C. With the temperature being not lower than 15° C., a treatment can be performed in a reduced time, and thus productivity further can be improved. With the temperature being not higher than 50° C., sufficient optical characteristics also can be obtained.

The stretch ratio of the polymer film in the swelling treatment is, for example, with respect to the length of the polymer film before being subjected to the swelling treatment (hereinafter, referred to also as a "raw film"), preferably 1.5 to 4.0 times, more preferably 1.7 to 3.8 times, and still more preferably 1.9 to 3.6 times for the following reason. That is, with such a ratio, the dye-affinity of a dichroic dye in a subsequent dyeing step is improved sufficiently, and optical characteristics also can be retained sufficiently. Particularly, the lower the stretch ratio, the further dyeing unevenness in the dyeing step, which will be described later, can be reduced. With a stretch ratio of not higher than 4 times, the occurrence of stripe unevenness further can be suppressed.

Preferably, in the swelling step, the total length of time in which the polymer film is impregnated in the swelling bath is not less than 100 seconds for the following reason. That is, with the length of time being not less than 100 seconds, swelling reaches or almost reaches a saturation state, and thus for example, the stretch ratio can be reduced to about 1.1 to 1.5 times, thereby allowing dyeing unevenness to be reduced further. Meanwhile, even in the case where the total length of time for the impregnation is less than 100 seconds, by the above-described stretching treatment, dyeing unevenness can be reduced.

(3) Dyeing Treatment

The polymer film is pulled out of the swelling bath, impregnated in, for example, a dyebath containing a dichroic substance, and further stretched uniaxially in the dyebath. That is, the polymer film is impregnated for adsorbing the dichroic substance and stretched for allowing the dichroic substance to be aligned in one direction.

Conventionally known substances can be used for the dichroic substance. The examples include iodine and organic dyestuffs. Preferably, in the case of using the organic dyestuffs, at least two of the organic dyestuffs are used in combination for neutralization of the visible light region.

As the solution for the dyebath, an aqueous solution prepared by dissolving the dichroic substance in a solvent can be used. For example, water can be used for the solvent, and an organic solvent compatible with water further may be added. The concentration of the dichroic substance in the solution is not particularly limited, and generally is in the range of 0.1 to 10.0 parts by mass with respect to 100 parts by mass of a solvent (for example, water). The solution further may contain potassium iodide or the like as an auxiliary.

There is no particular limitation on conditions under which the polymer film is impregnated in the dyebath, and as the conditions, the temperature for the dyebath is, for example, in the range of 20 to 70° C., and the length of time for the impregnation is, for example, in the range of 5 to 20 minutes. Further, preferably, the stretch ratio in the dyeing treatment is, for example, in the range of 2 to 4 times with respect to the length of the polymer film (raw film) before being impregnated.

(4) Crosslinking Treatment

The polymer film is pulled out of the dyebath, impregnated in a crosslinking bath containing a crosslinking agent, and further stretched in the crosslinking bath. The crosslinking treatment is performed to retain the running stability.

The crosslinking agent can be selected from conventionally known substances including boron compounds such as boric acid, borax, glyoxal, and glutaraldehyde. These substances may be used alone, or at least two of these may be used in combination. As the solution for the crosslinking bath, an aqueous solution prepared by dissolving the crosslinking agent in a solvent can be used. The solvent can be, for example, water, and also may further contain an organic solvent compatible with water.

The concentration of the crosslinking agent in the solution is not particularly limited, and in general, preferably is in the range of 0.1 to 10% by mass with respect to 100% by mass of the solvent (for example, water). In the case where boric acid is used as the crosslinking agent, the concentration is, for example, in the range of 1.5 to 8 wt %, and preferably in the range of 2 to 6 wt %.

In order to provide in-plane homogeneous characteristics to a polarizer, the solution may contain an auxiliary of, for example, iodide such as potassium iodide, lithium iodide, sodium iodide, zinc iodide, aluminum iodide, lead iodide, copper iodide, barium iodide, calcium iodide, tin iodide, titanium iodide or the like in addition to the boric acid compound. Among these, potassium iodide is used preferably in combination with boric acid. The content of the auxiliary in the solution is generally in the range of 0.05 to 15% by mass.

Although not particularly limited, the temperature for the crosslinking bath is generally in the range of 20 to 70° C., and preferably in the range of 40 to 60° C. The length of time for the impregnation of the polymer film is not particularly limited, and generally is 1 second to 15 minutes.

Preferably, the stretch ratio in this crosslinking treatment is, for example, 5 to 7 times with respect to the length of the raw film. In the case of stretching a polymer film, there is no particular limitation on the stretching method, the number of times stretching is performed, and the like. Stretching may be performed in each or either of the dyeing step and the crosslinking step as described above. Further, stretching also may be performed plural times in one step.

(5) Washing and Drying Treatments

The polymer film is pulled out of the stretching bath, washed with water and dried, and thus a polarizing film is obtained. Drying can be performed by, for example, natural drying, air-drying, heating or the like with no particular limitation thereto. As for drying by heating, generally, the heating is performed at a temperature of 20 to 80° C. for the length of time in the range of 1 to 10 minutes.

There is no particular limitation on the thickness of a polarizing film according to the present invention as a final product. For example, the thickness is generally in the range of 1 to 80 μm, and more preferably 2 to 45 μm. For example, with the thickness being not less than 1 μm, further increased mechanical strength can be obtained. Further, with the thickness being not more than 80 μm, for example, when the polarizing film is mounted in a liquid crystal display, the color change of a display panel can be suppressed sufficiently, and a reduction in thickness can be achieved easily.

Next, a polarizing film according to the present invention is a polarizing film that is produced by the first and second production methods according to the present invention, and can be used as, for example, a polarizer.

Furthermore, an optical film according to the present invention is characterized by including the polarizing film according to the present invention. The following description is directed to examples of such an optical film.

A first example of the optical film according to the present invention can be, for example, a polarizing plate including the polarizing film according to the present invention and a transparent protective layer, in which the transparent protective layer is disposed on at least one surface of the polarizing film. The transparent protective layer may be disposed only on one surface or each surface of the polarizing film. In the case where the transparent protective layer is laminated on each surface, for example, transparent protective layers of the same type or different types may be used.

Figure 4:
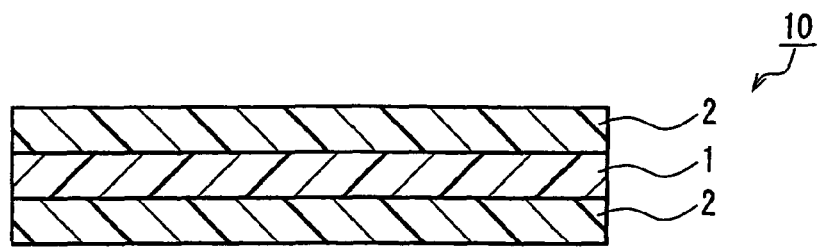
FIG. 4 is a cross-sectional view showing an example of an optical film according to the present invention.

FIG. 4 shows a cross-sectional view of an example of the polarizing plate. As shown in the figure, a polarizing plate 10 includes a polarizing film 1 and two transparent protective layers 2, and the transparent protective layers 2 are disposed on both surfaces of the polarizing film 1, respectively.

The transparent protective layer 2 can be selected from conventionally known transparent protective films without any particular limitations. It is preferable to use a transparent protective film excellent in, for example, transparency, mechanical strength, thermal stability, a moisture shielding property, and isotropism. Specific examples of materials for the above-described transparent protective layer include cellulose-based resins such as triacetylcellulose and the like, and transparent resins based on, for example, polyester, polycarbonate, polyamide, polyimide, polyethersulfone, polysulfone, polystyrene, acrylic substances, acetate, and polyolefin. Resins based on, for example, the acrylic substances, urethane, acrylic urethane, epoxy, and silicones that will be cured by heat or ultraviolet rays also can be used. Further, resins having a low photoelastic coefficient such as a polynorbornene-based resin and the like also is preferable.

Other examples include a film described in JP 2001-343529 A (WO 01/37007) and JP2002-328233 A, which is formed by extruding a resin composition containing an alternating copolymer of isobutene and N-methyl maleimide and an acrylonitrile-styrene copolymer. The above-described film can be produced, for example, in the following manner. That is, firstly, the alternating copolymer (100 parts by weight) containing 50 mol % of N-methyl maleimide and 67 parts by weight of the copolymer containing 27 wt % of acrylonitrile and 73 wt % of styrene are melted and mixed. A pellet of a resultant mixture is supplied to a melt-extruder having a T die so as to obtain a raw film. This film is subjected to free-end longitudinal uniaxial stretching under conditions of a stretching speed of 100 cm/min, a stretch ratio of 1.45 times and a stretching temperature of 162° C. Under the same conditions, the film further is subjected to free-end uniaxial stretching in a direction orthogonal to the direction of the above-mentioned stretching, and thus a stretched film having a thickness of 49 μm is obtained. This stretched film has the respective values of nx=1.548028, ny=1.548005, nz=1.547970, an in-plane retardation of 1.1 nm, a retardation in a thickness direction of 2.8 nm, and an absolute value of a photoelastic coefficient of $1.9 \times 10^{-13}$ cm$^2$/dye.

Moreover, for example, these transparent protective films may have a surface saponified with alkali or the like. Among such films, a TAC film is used preferably in light of its polarization characteristics and durability. It is more preferable to use a TAC film with a saponified surface.

It is preferable that the transparent protective layer is colorless, for example. Specifically, it is preferable that a retardation value (Rth) of the film in the thickness direction as represented by the following equation is in the range of −90 nm to +75 nm. More preferably, it is from −80 nm to +60 nm, and particularly preferably in the range of −70 nm to +45 nm. When the retardation value is within the range of −90 nm to +75 nm, coloring (optical coloring) of the polarizing plate, which is caused by the protective film, can be solved sufficiently.

$$Rth=[\{(nx+ny)/2\}-nz]\cdot d$$

In the above equation, d denotes a thickness of the transparent protective layer, while nx, ny and nz respectively denote refractive indices of X-axis, Y-axis and Z-axis in the transparent protective layer. The X axis denotes an axial direction presenting an in-plane maximum refractive index within the transparent protective layer, the Y-axis denotes an in-plane axial direction perpendicular to the X-axis, and the Z-axis denotes a thickness direction perpendicular to the X-axis and the Y-axis.

There is no particular limitation on the thickness of the transparent protective layer, and in order to achieve, for example, a reduction in thickness of the polarizing plate, the thickness is, for example, not more than 500 μm, preferably 1 to 300 μm, and more preferably in the range of 5 to 300 μm.

Furthermore, the transparent protective layer also may be subjected to a hard coating treatment, an antireflection treatment, treatments for anti-sticking, diffusion and anti-glaring and the like. The hard coating treatment aims to prevent scratches on surfaces of a polarizing plate, and is a treatment of, for example, providing a hardened coating film that is formed of a curable resin and has excellent hardness and smoothness onto a surface of the transparent protective layer. The curable resin can be selected from ultraviolet-curable resins based on silicone, urethane, acrylic substances, epoxy and the like. The treatment can be performed in a conventionally known method.

The antireflection treatment aims to prevent reflection of external light on the surface of the polarizing plate, and can be performed by forming a conventionally known antireflection film or the like. The anti-sticking treatment aims to prevent adjacent layers from sticking to each other.

The anti-glare treatment aims to prevent reflection of external light on a surface of the polarizing plate from hindering visibility of light transmitted through the polarizing plate. The anti-glare treatment can be performed, for example, by providing microscopic asperities on a surface of the transparent protective layer by a conventionally known method. Such microscopic asperities can be provided, for example, by roughening the surface by sand-blasting or embossing, or by blending transparent fine particles in the above-mentioned transparent resin when forming the transparent protective layer.

The above-described transparent fine particles can be selected from silica, alumina, titania, zirconia, stannic oxide, indium oxide, cadmium oxide, antimony oxide and the like and solid solutions thereof. The average diameter of the above-described transparent fine particles is, for example, in the range of 0.5 to 50 μm with no particular limitation thereto. Other than the above, for example, inorganic fine particles having electrical conductivity or organic fine particles comprising, for example, crosslinked or uncrosslinked polymer particles can be used as well. Further, in general, a blend ratio of the transparent fine particles is, preferably in the range of 2 to 50 parts by mass, and more preferably in the range of 5 to 25 parts by mass with respect to 100 parts by mass of the above-described transparent resin, though there is no particular limitation thereto.

An anti-glare layer into which the transparent fine particles are blended can be used as the transparent protective layer itself or may be formed as, for example, a coating layer applied onto a surface of the transparent protective layer. The anti-glare layer may function also as a diffusion layer to diffuse light transmitted through the polarizing plate in order to enlarge visual angles.

The above-described antireflection film, diffusion layer, anti-glare layer and the like also can be provided on the polarizing plate, for example, as a sheet of optical layers comprising these layers, separately from the transparent protective layer.

The above-described polarizer can be bonded to the transparent protective layer by a conventionally known method without any particular limitation thereto. In general, pressure-sensitive adhesives and other adhesives are used, and can be selected appropriately depending on, for example, the types of the polarizing film and the transparent protective layer. Specific examples thereof include adhesives and pressure-sensitive adhesives formed from PVA-based, denatured PVA-based, urethane-based polymers. In order to obtain improved durability, water-soluble crossliking agents for crosslinking vinyl alcohol-based polymers such as boric acid, borax, glutaraldehyde, melamine, oxalic acid, chitin, chitosan, metal salts, alcohol-based solvents and the like maybe added in these adhesives and the like. In the case where a PVA-based film is used as the polarizer, PVA-based adhesives are used preferably in light of, for example, stability of an adhering treatment. The thickness of such an adhesive layer is not particularly limited, and is, for example, 1 nm to 500 nm, preferably 10 nm to 300 nm, and more preferably 20 nm to 100 nm.

Preferably, in the case where the polarizer is bonded to the transparent protective layer with the adhesive, for example, in order to prevent peeling from occurring due to the influence of moisture and heat and to obtain a polarizing plate excellent in transmittance and polarization degree, a drying treatment is performed. The temperature at which drying is performed is not particularly limited and can be determined appropriately according to, for example, the type of an adhesive or a pressure-sensitive adhesive that is used. In the case where the adhesive is the above-mentioned PVA-based, denatured PVA-based, urethane-based water-soluble adhesive or the like, for example, drying is performed at a temperature of, preferably 60 to 70° C., and more preferably 60 to 75° C. for, preferably about 1 to 10 minutes.

Figure 5:
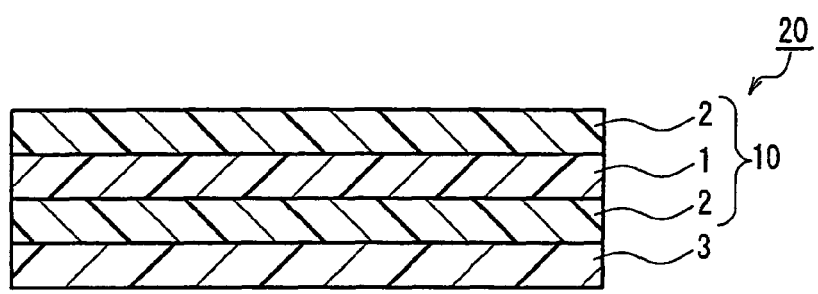
FIG. 5 is a cross-sectional view showing another example of the optical film according to the present invention.

Furthermore, preferably, the polarizing plate according to the present invention further includes a pressure-sensitive adhesive layer provided in its outermost layer in order to facilitate lamination onto, for example, a liquid crystal cell or the like. FIG. 5 shows a cross-sectional view of a polarizing plate including a pressure-sensitive adhesive layer as described above. As shown in the figure, a polarizing plate 20 includes the polarizing plate 10 shown in FIG. 4 and a pressure-sensitive adhesive layer 3, and the pressure-sensitive adhesive layer 3 further is disposed on a surface of one of the transparent protective layers 2 of the polarizing plate 10.

The pressure-sensitive adhesive layer can be formed on the surface of the transparent protective layer, for example, in the following manners. That is, a solution or melt of a pressure-sensitive adhesive is applied directly on a predetermined surface of the transparent protective layer by an expanding method such as flow-expanding, coating or the like. Alternatively, a pressure-sensitive adhesive layer is formed similarly on a separator, which will be described later, and transferred onto a predetermined surface of the transparent protective layer. Such a pressure-sensitive adhesive layer may be formed on either surface of a polarizing plate as shown in FIG. 5 with no limitation thereto, and also may be disposed on each surface thereof as required.

The pressure sensitive adhesive layer can be formed by appropriately using any of conventionally known pressure-sensitive adhesives based on, for example, acrylic substances, silicone, polyester, polyurethane, polyether, rubber and the like. Particularly, pressure-sensitive adhesives having a low moisture absorption coefficient and excellent heat resistance are used preferably from the aspects of prevention of foaming or peeling caused by moisture absorption, prevention of deterioration in optical characteristics and warping of a liquid crystal cell caused by a difference in thermal expansion coefficients, and formation of a liquid crystal display with high quality and excellent durability. Examples of such a pressure-sensitive adhesive include pressure-sensitive adhesives based on acrylic substances, silicone, acrylic-silicone, polyester, heat-resistant rubber and the like. Further, for example, a pressure-sensitive adhesive layer that contains fine particles and exhibits a light diffusion property also may be used.

Furthermore, in the case where a surface of a pressure-sensitive adhesive layer provided on the polarizing plate is exposed, it is preferable to cover the surface with a separator for, for example, the prevention of contamination until the pressure-sensitive adhesive layer is put into use. The separator can be formed of, for example, a suitable thin film such as the above-mentioned transparent protective film or the like that is provided with a release coat such as a coat of a silicone-based release agent, a long-chain alkyl-based release agent, a fluorine-based release agent or molybdenum sulfide, as required.

The thickness of the pressure-sensitive adhesive layer is not particularly limited, and is, for example, preferably 5 to 35 μm, more preferably 10 to 25 μm, and particularly preferably 15 to 25 μm for the following reason. That is, with the thickness being set to be in the above-mentioned ranges, for example, even when a polarizing plate is changed in size, a stress caused at that time also can be relieved.

Furthermore, the polarizing plate according to the present invention can be used to form a liquid crystal cell, a liquid crystal display or the like. In this case, the polarizing plate may be prepared, for example, in the following manners. That is, a laminate of the polarizer, a transparent protective layer and the like is subjected to cutting (chip-cutting) so as to correspond to the size of a liquid crystal cell or the like. Alternatively, the polarizer is subjected to cutting beforehand, and then the transparent protective layer is bonded thereto.

Next, a second example of the optical film according to the present invention is a laminate including the polarizer according to the present invention or the polarizing plate of the first example and at least one of a polarization converting element and a retardation film.

There is no particular limitation on the polarization converting element. Examples thereof include an anisotropic reflective polarization element and an anisotropic scattering polarization element that are used commonly to form liquid crystal displays. For example, one or more of these polarization converting elements may be laminated. Further, in the case of laminating two or more layers, the layers may be of the same type or different types.

Among the polarization converting elements, the anisotropic reflective polarization element is, for example, a composite of a cholesteric liquid crystal layer and a retardation plate, and it is preferable that the retardation plate has a retardation value that is 0.2 to 0.3 times a wavelength within a reflection band of the anisotropic reflective polarizer. It is more preferable that the retardation value is 0.25 times the wavelength.

As the cholesteric liquid crystal layer, particularly, for example, an alignment film of a cholesteric liquid crystal polymer or an alignment liquid crystal layer fixed onto a film substrate, which reflects either clockwise or counterclockwise circularly polarized light while transmitting other light is used preferably. As such an anisotropic reflective polarization element, for example, trade name PCF series produced by Nitto Denko Corporation, can be used. The above-mentioned wavelength is arbitrary as long as the wavelength is within the reflection band of the anisotropic reflective polarizer. Further, the cholesteric liquid crystal layer also may be a multilayer thin film of a dielectric or a multilayer laminate of thin films varying in refractive index anisotropy, which transmits linearly polarized light having a predetermined polarization axis while reflecting other light. As such an anisotropic reflective polarization element, for example, trade name DBEF series produced by 3M Co., can be used.

Furthermore, as the anisotropic reflective polarization element, a reflective grid polarizer is used preferably, and specific examples thereof include trade name MicroWires produced by Moxtek, Inc.

Meanwhile, as the anisotropic scattering polarization element, for example, trade name DRPF produced by 3M Co. can be used.

Next, a third example of the optical film according to the present invention can be, for example, any of various types of polarizing plates that are laminates including, as well as various optical layers, the polarizer according to the present invention, the polarizing plate of the first example, or the laminate of the second example. Though there is no particular limitation on the optical layers, the examples include optical layers used for forming liquid crystal displays and the like, i.e., a reflector, a semitransparent reflector, a retardation plate such as, for example, a λ plate like a half wavelength plate and a quarter wavelength plate or the like, a visual angle compensating film, and a brightness enhancement film. These optical layers may be used alone or two or more types of these layers may be used in combination. As polarizing plates including such optical layers, particularly preferable are a reflective polarizing plate, a semitransparent reflective polarizing plate, an elliptically polarizing plate, a circularly polarizing plate, a polarizing plate on which a visual angle compensating film is laminated, and a polarizing plate on which a brightness enhancement film is laminated.

The respective polarizing plates will be described below.

First, an example of a reflective polarizing plate or a semitransparent reflective polarizing plate according to the present invention will be described. The reflective polarizing plate is formed of, for example, the polarizing plate described in the first example on which a reflector further is laminated. The semitransparent reflective polarizing plate is formed of the polarizing plate on which a semitransparent reflector is laminated.

In general, the reflective polarizing plate is arranged on the backside of a liquid crystal cell in order to make a liquid crystal display (reflective liquid crystal display) to reflect incident light from a viewing side (display side). The reflective polarizing plate has some advantages, for example, that assembling of light sources such as a backlight can be omitted, and that the liquid crystal display can be thinned further.

The reflective polarizing plate can be formed by any conventionally known method such as forming a reflector of metal or the like on one surface of the polarizing plate that has been subjected to the above-described heating treatment. Specifically, for example, a transparent protective layer of the polarizing plate is prepared by matting one surface (exposed surface) if required. On this surface, a foil comprising a reflective metal such as aluminum or a deposition film is applied as a reflector to form a reflective polarizing plate.

Another example of the reflective polarizing plate is formed in the following manner. That is, as described above, fine particles are contained in any of various types of transparent resins to form a transparent protective layer with a surface on which microscopic asperities are provided, and a reflector corresponding the microscopic asperities is formed on the transparent protective layer. The reflector having a microscopic asperity surface has an advantage of, for example, diffusing incident light by irregular reflection so that directivity and glare can be prevented and unevenness of color tones can be suppressed. This reflector can be formed as the metal foil or a metal deposition film directly on a microscopic asperity surface of the transparent protective layer by any of conventionally known methods including deposition such as vacuum deposition, and plating such as ion plating and sputtering.

As mentioned above, the reflector can be formed directly on a transparent protective layer of a polarizing plate. Alternatively, as the reflector, for example, a reflecting sheet formed by providing a reflecting layer on a proper film similar to the transparent protective film may be used. In general, the reflecting layer in the reflector is made of a metal, and thus it is preferable to use the reflecting layer in a state where a reflecting surface thereof is coated with the film, a polarizing plate or the like from the aspects of, for example, preventing a decrease in reflection rate due to oxidation, thereby maintaining an initial reflection rate for a long period, and eliminating the need of forming an additional transparent protective layer.

The semitransparent polarizing plate is provided by replacing the reflector in the above-described reflective polarizing plate by a semitransparent reflector. The semitransparent reflector is exemplified by a half mirror that reflects and transmits light at a reflecting layer.

In general, the semitransparent polarizing plate is arranged on the backside of a liquid crystal cell. In a liquid crystal display or the like comprising the semitransparent polarizing plate, incident light from a viewing side (display side) is reflected to display an image when the liquid crystal display or the like is used in a relatively bright atmosphere, while in a relatively dark atmosphere, an image is displayed by using a built-in light source such as a backlight in the backside of the semitransparent polarizing plate. In other words, the semitransparent polarizing plate can be used effectively to form a liquid crystal display or the like that can save energy for a light source such as a backlight under a bright atmosphere, while using the built-in light source under a relatively dark atmosphere.

Next, an example of an elliptically polarizing plate or a circularly polarizing plate according to the present invention will be described. Each of these polarizing plates is formed of, for example, the above-described polarizing plate of the first example on which a retardation plate or a λ plate further is laminated.

The elliptically polarizing plate is effective, for example, in compensating (preventing) colors (blue or yellow) generated due to birefringence in a liquid crystal layer of a super twist nematic (STN) liquid crystal display so as to provide black-and-white display free of such colors. An elliptically polarizing plate with a controlled three-dimensional refractive index is further preferable since it can compensate (prevent) colors that will be observed when a screen of the liquid crystal display is viewed from an oblique direction. The circularly polarizing plate is effective, for example, in adjusting color tones of an image of a reflective liquid crystal display providing color image display, and serves to prevent reflection as well.

The retardation plate is used for converting linearly polarized light into either elliptically polarized light or circularly polarized light, converting either elliptically polarized light or circularly polarized light into linearly polarized light, or modifying a polarization direction of linearly polarized light. Particularly, for example, a retardation plate called a quarter wavelength plate (referred to also as a λ/4 plate) is used for converting linearly polarized light into either elliptically polarized light or circularly polarized light, and for converting either elliptically polarized light or circularly polarized light into linearly polarized light. A half wavelength plate (referred to also as a λ/2 plate) is used in general for modifying a polarization direction of linearly polarized light.

Examples of the retardation plate include birefringent films, alignment films of liquid crystal polymers, and laminates of alignment layers of liquid crystal polymers supported by films. The birefringent films can be prepared by stretching polymer films such as films of polycarbonate, PVA, polystyrene, polymethyl methacrylate, polyolefins including polypropylene, polyalylate, polyamide, polynorbornene, and the like.

The retardation plate may have a retardation suitable for intended uses such as compensation of a visual angle for, for example, enlarging a visual angle and compensation of coloring caused by birefringence in a liquid crystal layer or plates having varying wavelengths such as the half wavelength plate, the quarter wavelength plate and the like. Alternatively, the retardation plate may be an inclined alignment film having a controlled refractive index in the thickness direction. Two or more types of retardation plates may be laminated for forming a laminate with controlled optical characteristics such as a retardation and the like.

The inclined alignment film is produced, for example, by bonding a heat shrinkable film to a polymer film and stretching and/or shrinking the polymer film under an action of a shrinkage force provided by heating, or by obliquely aligning a liquid crystal polymer.

Next, the description is directed to an example of a polarizing plate formed of the polarizing plate of the first example on which a visual angle compensating film further is laminated.

The visual angle compensating film is used, for example, for widening a visual angle so that an image can be clear relatively when a screen of a liquid crystal display is viewed not in a direction perpendicular to the screen but in a slightly oblique direction. Such a visual angle compensating film can be, for example, a triacetylcellulose film or the like coated with a discotic liquid crystal, or a retardation plate. While an ordinary retardation plate is, for example, a birefringent polymer film that is stretched uniaxially in its plane direction, a retardation plate used for the visual angle compensating film is, for example, a two-way stretched film such as a birefringent polymer film stretched biaxially in a plane direction and an inclined alignment polymer film with a controlled refractive index in a thickness direction that is stretched uniaxially in a plane direction and stretched also in a thickness direction. The inclined alignment film is prepared, for example, by bonding a heat shrinkable film to a polymer film and stretching and/or shrinking the polymer film under an action of a shrinkage force provided by heating, or by obliquely aligning a liquid crystal polymer. The polymer film can be formed from a material similar to the above-mentioned polymers used to form the above-described retardation plate.

Next, the description is directed to an example of a polarizing plate formed of the polarizing plate of the first example on which a brightness enhancement film further is laminated.

Generally, this polarizing plate is arranged on a backside of a liquid crystal cell. When natural light enters, for example, by reflection from a backlight or a backside of a liquid crystal display or the like, the brightness enhancement film reflects linearly polarized light of a predetermined polarization axis or circularly polarized light in a predetermined direction while transmitting other light. It allows entrance of light from a light source such as a backlight so as to obtain transmitted light in a predetermined polarization state, while reflecting light other than light in the predetermined polarization state. Light that is reflected at this brightness enhancement film is reversed through a reflector or the like arranged behind the brightness enhancement film. The reversed light that re-enters the brightness enhancement film is transmitted partly or entirely as light in the predetermined polarization state, so that light transmitted through the brightness enhancement film is increased and polarized light that is hardly absorbed in a polarizing film (polarizer) is supplied. As a result, quantity of light available for liquid crystal display or the like can be increased to enhance brightness. When light enters through the polarizer from the backside of a liquid crystal cell by using a backlight or the like without using the brightness enhancement film, most light is absorbed in the polarizer but not transmitted through the polarizer if the light has a polarization direction inconsistent with the polarization axis of the polarizer. Depending on characteristics of the polarizer that is used, about 50% of light is absorbed in the polarizer, and this decreases quantity of light available for liquid crystal display or the like and makes the image dark. The brightness enhancement film repeatedly prevents light having a polarization direction with which light is absorbed in the polarizer from entering the polarizer, reflects the light once on the brightness enhancement film, further reverses the light through a reflector or the like arranged behind the brightness enhancement film, and makes the light re-enter the brightness enhancement film. Since the polarized light that is reflected and reversed between them is transmitted and supplied to the polarizer only if the light has a polarization direction with which light can be transmitted through the polarizer, light from a backlight or the like can be used efficiently for displaying images of a liquid crystal display in order to provide a bright screen.

A diffusion plate may be arranged between the brightness enhancement film and the reflecting layer or the like. In this case, polarized light reflected by the brightness enhancement film is directed to the reflecting layer. The diffusion plate diffuses the light being transmitted therethrough uniformly and at the same time, it cancels the polarization so as to provide a depolarized state. Namely, the diffusion plate converts the light back into its original state as natural light. This depolarized light, i.e., natural light is directed to the reflecting layer or the like, reflected at the reflecting layer, and transmitted again through the diffusion plate so as to re-enter the brightness enhancement film. The state of natural light is recovered by repeating this series of actions. Thereby, the diffusion plate serves, for example, to maintain brightness of the display screen and decrease unevenness of the brightness at the same time, and thus a screen with uniform brightness can be provided. Further, the diffusion plate has a diffusion function and further can increase appropriately the repeated reflection of the initial incident light. Conceivably, this makes it possible to provide a display screen with uniform brightness.

Though there is no particular limitation, the brightness enhancement film can be selected from a multilayer thin film of a dielectric and a multilayer laminate of thin films varying in refractive index anisotropy that transmit linearly polarized light having a predetermined polarization axis while reflecting other light. Specifically, for example, trade name D-BEF produced by 3M Co. can be used as the brightness enhancement film. The brightness enhancement film also may be, for example, a cholesteric liquid crystal layer, particularly, an alignment film of a cholesteric liquid crystal polymer, or an alignment liquid crystal layer fixed onto a film substrate that reflects either clockwise or counterclockwise circularly polarized light while transmitting other light. Examples of such a film include trade name "PCF350" produced by Nitto Denko Corporation and trade name Transmax produced by Merck and Co., Inc.

Therefore, for a brightness enhancement film to transmit linearly polarized light having a predetermined polarization axis, for example, the transmission light enters the polarizing plate by matching the polarization axis so that absorption loss due to the polarizing plate is suppressed and the light can be transmitted efficiently. For a brightness enhancement film to transmit circularly polarized light, i.e., a cholesteric liquid crystal layer, preferably, the transmission circularly polarized light is converted into linearly polarized light before entering the polarizing plate from the aspect of suppressing the absorption loss, though the circularly polarized light can enter the polarizer directly. Circularly polarized light can be converted into linearly polarized light by using, for example, a quarter wavelength plate for a retardation plate.

A retardation plate having a function as a quarter wavelength plate in a wide wavelength range including a visible light region can be obtained, for example, by laminating a retardation layer functioning as a quarter wavelength plate for monochromatic light such as light having 550 nm wavelength and another retardation layer exhibiting other optical retardation characteristics (for example, a retardation layer functioning as a half wavelength plate). Therefore, a retardation plate arranged between a polarizing plate and a brightness enhancement film may comprise a single layer or at least two layers of retardation layers. A cholesteric liquid crystal layer also can be provided by combining layers different in the reflection wavelength and it can be configured by laminating two or at least three layers. As a result, the obtained retardation plate can reflect circularly polarized light in a wide wavelength range including a visible light region, and this can provide transmission circularly polarized light in a wide wavelength range.

Each of the above-described various types of polarizing plates of the third example also may be, for example, an optical film made by laminating the above-described polarizing plate and two or at least three additional optical layers. Specific examples thereof include a reflective elliptically polarizing plate or a semitransparent elliptically polarizing plate that is prepared by combining either the above-described reflective polarizing plate or semitransparent polarizing plate with a retardation plate.

As described above, an optical film comprising a laminate of at least two optical layers can be formed by, for example, a method of laminating layers separately in a certain order for producing a liquid crystal display or the like. Alternatively, an optical member of laminates that have been laminated previously also can be used advantageously since it has excellent stability in quality and assembling operability, thereby providing improved efficiency in producing a liquid crystal display or the like. In the same manner as described above, any adhesion means such as a pressure-sensitive adhesive layer or the like can be used for the lamination.

The above-described members constituting the optical film according to the present invention, i.e. the polarizing film, the transparent protective layer, the optical layer, the pressure-sensitive adhesive layer and the like may have ultraviolet absorption power as a result of an appropriate treatment with an ultraviolet absorber such as an ester salicylate compound, a benzophenone compound, a benzotriazole compound, a cyanoacrylate compound, a nickel complex salt compound or the like.

Next, a liquid crystal panel according to the present invention includes at least one of the polarizer and optical film (hereinafter, referred to also as an "optical film") according to the present invention, which is disposed on at least one surface of a liquid crystal cell.

There is no particular limitation on the type of the liquid crystal cell, and conventionally known liquid crystal cells can be used appropriately. Particularly, since the polarizer and the like according to the present invention are used effectively in a liquid crystal display that allows polarized light to be incident on a liquid crystal cell to provide display, for example, liquid crystal cells using a TN (Twisted Nematic) liquid crystal and a STN (Super Twisted Nematic) liquid crystal are preferable. Further, alternatively, for example, a liquid crystal cell using a non-twisted liquid crystal such as of an IPS (In-Plane Switching) mode, a VA (Vertical Aligned) mode, or an OCB (Optically Compensated Birefringence) mode, a liquid crystal cell using a guest-host liquid crystal in which the above-mentioned dichroic dye is dispersed, or a liquid crystal cell using a ferroelectric liquid crystal also can be used. The method of driving a liquid crystal also is not particularly limited.

An optical film such as the above-described polarizing plate or the like may be disposed only on one surface or each surface of the liquid crystal cell. In the case where the optical film is disposed on each surface of the liquid crystal cell, optical films of the same type or different types may be used. Further, in the case where a polarizing plate and an optical member are provided on each side of a liquid crystal cell, these members may be of the same type or different types, respectively.

Furthermore, one or at least two components in general use such as a prism array sheet, a lens array sheet, a light diffusion plate and the like further may be arranged at suitable positions, respectively.

Figure 6:
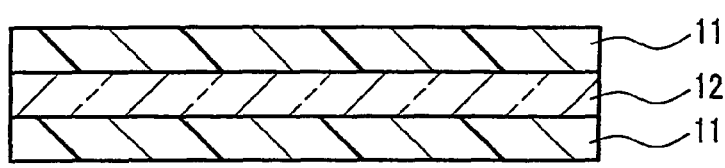
FIG. 6 is a cross-sectional view showing an example of a liquid crystal panel according to the present invention.
Figure 7:
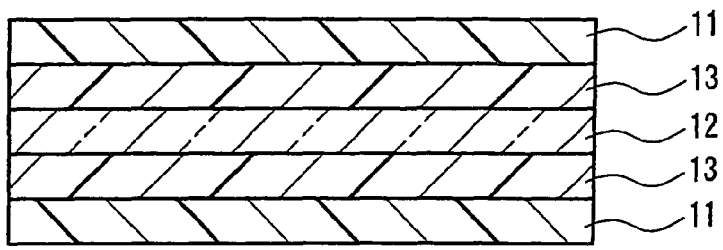
FIG. 7 is a cross-sectional view showing another example of the liquid crystal panel according to the present invention.

FIGS. 6 to 8 show examples of a liquid crystal panel in which the optical film according to the present invention is disposed. In each of these figures, a state of lamination of a liquid crystal cell and the optical film is shown in cross section, and constituents are distinguished by hatching. Further, in the figures, like reference numerals indicate like members. The liquid crystal panel according to the present invention is not limited to these examples.

A liquid crystal panel shown in FIG. 6 includes a liquid crystal cell 12 and polarizing plates 11, and the polarizing plates 11 are provided on both surfaces of the liquid crystal cell 12, respectively. There is no particular limitation on the structure of the liquid crystal cell (not shown), and the liquid crystal cell generally has a structure in which a liquid crystal is held between an array substrate and a filter substrate.

Furthermore, a liquid crystal panel shown in FIG. 7 includes a liquid crystal cell 12, polarizing plates 11 and retardation plates 13, and the polarizing plates 11 are laminated on both surfaces of the liquid crystal cell 12 through the retardation plates 13, respectively. The retardation plate 13 and the polarizing plate 11 also may be used integrally as the optical film according to the present invention and disposed on each surface of the liquid crystal cell 12.

Figure 8A:
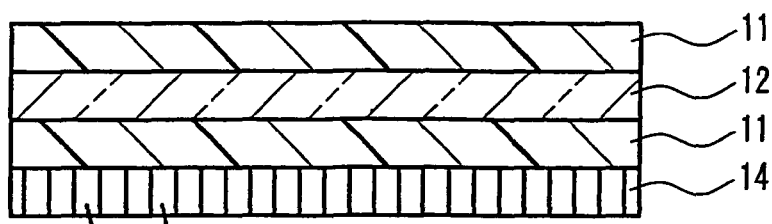
FIG. 8 shows in (A) a cross-sectional view showing still another example of the liquid crystal panel according to the present invention, and (B) and (C) are partial cross-sectional views of (A).
Figure 8B:
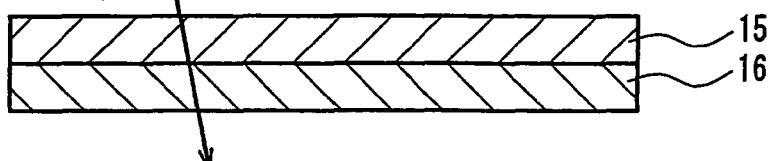
Figure 8C:

A liquid crystal panel shown in FIG. 8(A) includes a liquid crystal cell 12, polarizing plates 11 and a polarization converting element 14. The polarizing plates 11 are laminated respectively on both surfaces of the liquid crystal cell 12, and the polarization converting element 14 further is laminated on one surface of one of the polarizing plates. The polarization converting element 14 can selected from the above-described elements, and examples thereof include a composite of a quarter wavelength plate 15 and a cholesteric liquid crystal 16 shown in FIG. 8(B) and an anisotropic multiple thin-film reflective polarization element 17 shown in FIG. 8(C). The polarizing plate 11 and the polarization converting element 14 also may be used integrally as the optical film according to the present invention and disposed on one surface of the liquid crystal cell 12.

Next, a liquid crystal display according to the present invention is a liquid crystal display including a liquid crystal panel, in which the liquid crystal panel is the liquid crystal panel according to the present invention.

The liquid crystal display further may include a light source. The light source is not particularly limited, and preferably is, for example, a flat light source that emits polarized light so as to allow light energy to be used effectively.

In the liquid crystal display according to the present invention, for example, a diffusion plate, an anti-glare layer, an antireflection film, a protective layer/plate further can be arranged on an optical film (polarizing plate) at a viewing side. Alternatively, for example, a retardation plate for compensation can be arranged appropriately between a liquid crystal cell and a polarizing plate in a liquid crystal panel.

Next, an electroluminescence (EL) display according to the present invention is a display including at least one of the polarizer according to the present invention and the optical film according to the present invention. This EL display may be either of an organic EL display and an inorganic EL display.

Recently, for EL displays, for example, use of an optical film such as a polarizer, a polarizing plate or the like together with a λ/4 plate is suggested for preventing reflection from an electrode in a black state. The polarizer and optical film according to the present invention is useful particularly when any of linearly polarized light, circularly polarized light or elliptically polarized light is emitted from an EL layer, or when obliquely emitted light is polarized partially even if natural light is emitted in the front direction.

The following description is about a typical organic EL display. In general, the organic EL display has a luminant (organic EL ruminant) that is prepared by laminating a transparent electrode, an organic luminant layer and a metal electrode in this order on a transparent substrate. Here, the organic luminant layer is a laminate of various organic thin films. Known examples thereof include a laminate of a hole injection layer made of a triphenylamine derivative or the like and a luminant layer made of a phosphorous organic solid such as anthracene or the like; a laminate of the luminant layer and an electron injection layer made of a perylene derivative or the like; and a laminate of the hole injection layer, the luminant layer and the electron injection layer.

The organic EL display emits light on the principle of a system in which a voltage is applied to the anode and the cathode so as to inject holes and electrons into the organic luminant layer, energy generated by the re-bonding of these holes and electrons excites the phosphor, and the excited phosphor emits light when it returns to the basis state. The re-bonding mechanism of the holes and electrons is similar to that of an ordinary diode. Current and the light emitting intensity exhibit a considerable nonlinearity accompanied with rectification with respect to the applied voltage.

It is required for the organic EL display that at least one of the electrodes be transparent so as to obtain luminescence at the organic luminant layer. In general, a transparent electrode of a transparent conductive material such as indium tin oxide (ITO) or the like is used for the anode. Use of substances having small work function for the cathode is effective for facilitating the electron injection and thereby raising luminous efficiency, and in general, metal electrodes such as of Mg—Ag, Al—Li and the like may be used.

In an organic EL display configured as described above, it is preferable that the organic luminant layer is made of a film that is as extremely thin as about 10 nm. This allows the organic luminant layer to transmit substantially whole light as the transparent electrode does. As a result, when the layer does not illuminate, light entering from the surface of the transparent substrate is transmitted through the transparent electrode and the organic ruminant layer to be reflected at the metal layer, and it comes out again to the surface side of the transparent substrate. Thereby, the display surface of the organic EL display looks like a mirror when viewed from exterior.

The organic EL display according to the present invention includes, for example, the organic EL ruminant formed by providing a transparent electrode on the surface side of the organic ruminant layer and a metal electrode on the backside of the organic ruminant layer, and preferably, the polarizing film (for example, a polarizing plate) according to the present invention is arranged on the surface of the transparent electrode. More preferably, a λ/4 plate is arranged between the polarizing plate and an EL device. By arranging the optical film according to the present invention, the organic EL display has an effect of suppressing external reflection and improving visibility. It is also preferable that a retardation plate further is arranged between the transparent electrode and the optical film.

The retardation plate and the optical film (for example, the polarizing plate or the like) function to polarize light which enters from outside and is reflected by the metal electrode, and thus the polarization has an effect that the mirror of the metal electrode cannot be viewed from exterior. Particularly, the mirror of the metal electrode can be blocked completely by forming the retardation plate with a quarter wavelength plate and adjusting an angle formed by the polarization direction of the retardation plate and the polarizing plate to be π/4. That is, the polarizing plate transmits only the linearly polarized light constituent among the external light entering the organic EL display. In general, the linearly polarized light is converted into elliptically polarized light by the retardation plate. When the retardation plate is a quarter wavelength plate and when the angle of the polarization direction provided by the polarizing plate and the retardation plate is π/4, the light turns into circularly polarized light.

This circularly polarized light is transmitted through the transparent substrate, the transparent electrode, and the organic thin films. After being reflected by the metal electrode, the light is transmitted again through the organic thin films, the transparent electrode and the transparent substrate, and turns into linearly polarized light at the retardation plate. Moreover, since the linearly polarized light crosses the polarization direction of the polarizing plate at a right angle, it cannot pass through the polarizing plate. As a result, the mirror of the metal electrode can be blocked completely as described above.

Furthermore, an in-house production method of a liquid crystal display and an EL display according to the present invention is a production method including a step in which at least one of the polarizer according to the present invention and the optical film according to the present invention, in each of which a surface protective film is provided on a display surface side, and a pressure-sensitive adhesive layer and a release layer are provided on the other surface, is attached to the display immediately after being subjected to chip-cutting.

In the in-house production method for producing various displays in which the polarizer or the optical film is cut and attached to a liquid crystal cell or the like in a seamless manner as described above, for example, measurement should be performed instantly in order to detect a defective area, and thus it is required to determine the need for markings by establishing a boundary sample or performing in-line measurement. According to the production method of the present invention, various displays can be produced in the following manner. That is, with respect to the polarizer or optical film according to the present invention, markings are provided on portions that do not satisfy the conditions, and immediately after performing punching, the polarizer or the optical film is attached to a liquid crystal panel or an EL display. As described above, with respect to a polarizer or an optical film, a sequence of steps of punching, screening and attaching can be performed in a seamless manner, and thus inspection can be performed in a shorter time, thereby also allowing production to be simplified and less costly. Generally, in-house production refers to a total line of production in which with respect to a rolled raw film of a polarizing plate, punching, inspection and attaching to a LCD are performed.

EXAMPLES

Next, the present invention will be described further by way of the following examples and comparative examples. However, the present invention is not limited only to these examples. Unless otherwise specified, "%" represents "% by mass".

Example 1

As shown in FIG. 1, two guide rolls (flat rolls) were arranged in a swelling bath, and pure water as a swelling solvent was put therein and kept at 25° C. beforehand. A raw PVA film (trade name VF-PS#7500; produced by Kuraray Co., Ltd.) having a thickness of 75 μm was conveyed by means of the guide rolls into the swelling bath so as to be swollen therein, and further was stretched to a length 2.5 times the length of the raw film. A length of time (a) between the time when the film was brought into contact with the solvent in the swelling bath and the time when the film was brought into contact with a first guide roll by conveyance was set to be 3.5 seconds, and a length of time (b) between the time when the film was brought into contact with the first guide roll and the time when the film was brought into contact with a second guide roll was set to be 60 seconds. Further, an arbitrary point on the film was impregnated in the swelling bath for 92 seconds in total.

This film was impregnated in a mixed solution of 0.04% iodine and 0.4% potassium iodide (hereinafter, referred to as a dyebath), and dyed therein while being stretched to a length 3 times the length of the raw film. The film further was impregnated in an aqueous solution of 3.5% boric acid (stretching bath) and stretched to a length 6 times the length of the raw film, and thus a polarizing film (having a thickness of 27 μm) was formed. Further, a TAC film (trade name TD-80U; produced by Fuji Photo Film Co., Ltd.) having a thickness of 80 μm was saponified, and a resultant film was attached to each surface of the above-described polarizing film using an aqueous solution of 1% PVA and dried, and thus a polarizing plate was formed.

Example 2

A polarizing film and a polarizing plate were formed in the same manner as in Example 1. However, in this example, in a swelling treatment, a length of time (a) between the time when a film was brought into contact with a solvent in a swelling bath and the time when the film was brought into contact with a first guide roll by conveyance was set to be 2 seconds, and a length of time (b) between the time when the film was brought into contact with the first guide roll and the time when the film was brought into contact with a second guide roll was set to be 35 seconds. An arbitrary point on the film was impregnated in the swelling bath for 63 seconds in total.

Example 3

A polarizing film and a polarizing plate were formed in the same manner as in Example 1. However, in this example, in a swelling treatment, a length of time (a) between the time when a film was brought into contact with a solvent in a swelling bath and the time when the film was brought into contact with a first guide roll by conveyance was set to be 11 seconds, and a length of time (b) between the time when the film was brought into contact with the first guide roll and the time when the film was brought into contact with a second guide roll was set to be 110 seconds. An arbitrary point on the film was impregnated in the swelling bath for 130 seconds in total.

Example 4

A polarizing film and a polarizing plate were formed in the same manner as in Example 1. However, in this example, as shown in FIG. 2, one guide roll was arranged in a swelling bath, and a length of time (c) between the time when a film was brought into contact with a solvent in the swelling bath and the time when the film was brought into contact with a first guide roll by conveyance was set to be 70 seconds. An arbitrary point on the film was impregnated in the swelling bath for 75 seconds in total.

Example 5

As shown in FIG. 1, two guide rolls were arranged in a swelling bath, and water as a swelling solvent was put therein and kept at 32° C. beforehand. A raw PVA film (trade name OPL-M; produced by The Nippon Synthetic Chemical Industry Co., Ltd.) having a thickness of 75 μm was conveyed by means of the guide rolls into the swelling bath so as to be swollen therein, and further was stretched to a length 1.9 times the length of the raw film. A length of time (a) between the time when the film was brought into contact with the solvent in the swelling bath and the time when the film was brought into contact with a first guide roll by conveyance was set to be 5 seconds, a the length of time (b) between the time when the film was brought into contact with the first guide roll and the time when the film was brought into contact with a second guide roll was set to be 77 seconds. An arbitrary point on the film was impregnated in the swelling bath for 121 seconds in total.

This film was impregnated in a mixed solution of 0.04% iodine and 0.4% potassium iodide (dyebath), and dyed therein while being stretched to a length 2.8 times the length of the raw film. The film further was impregnated in an aqueous solution of 3.5% boric acid (stretching bath) and stretched to a length 6 times the length of the raw film, and thus a polarizing film (having a thickness of 30 μm) was formed. Further, a TAC film that is the same as described above was saponified, and a resultant film is attached to each surface of the polarizing film using an aqueous solution of 1% PVA and dried, and thus a polarizing plate was formed.

Example 6

A polarizing film and a polarizing plate were formed in the same manner as in Example 1. However, in this example, a PVA film that is the same as used for Example 5 was used, and spiral rolls were used as the guide rolls. Further, a length of time (a) between the time when the film was brought into contact with a solvent in a swelling bath and the time when the film was brought into contact with a first guide roll was set to be 11 seconds, and a length of time (b) between the time when the film was brought into contact with the first guide roll and the time when the film was brought into contact with a second guide roll was set to be 110 seconds. A groove (indentation) of the spiral rolls had a width of 1 cm and a depth of 1 cm. An arbitrary point on the film was impregnated in the swelling bath for 128 seconds in total.

Example 7

A polarizing film and a polarizing plate were formed in the same manner as in Example 1. However, in this example, a PVA film that is the same as used for Example 5 was used, and crown rolls were used as the guide rolls. Further, with respect to the length of a raw film, a stretch ratio of stretching in a swelling bath was set to be 2.1 times, and a stretch ratio of stretching in a dyebath was set to be 2.9 times. Further, a length of time (a) between the time when the film was brought into contact with a solvent in the swelling bath and the time when the film was brought into contact with a first guide roll by conveyance was set to be 2 seconds, and a length of time (b) between the time when the film was brought into contact with the first guide roll and the time when the film was brought into contact with a second guide roll was set to be 35 seconds. An arbitrary point on the film was impregnated in the swelling bath for 63 seconds in total.

Example 8

A polarizing film and a polarizing plate were formed in the same manner as in Example 1. However, in this example, a PVA film that is the same as used for Example 5 was used, and the temperature of a swelling bath was set to be 42° C. Further, in a swelling treatment, a length of time (a) between the time when the film was brought into contact with a solvent in a swelling bath and the time when the film was brought into contact with a first guide roll by conveyance was set to be 6 seconds, and a length of time (b) between the time when the film was brought into contact with the first guide roll and the time when the film was brought into contact with a second guide roll was set to be 60 seconds. An arbitrary point on the film was impregnated in the swelling bath for 95 seconds in total Example 9

A polarizing film and a polarizing plate were formed in the same manner as in Example 4. However, in this example, as shown in FIG. 2, one guide roll (crown roll) was arranged in a swelling bath, and a PVA film that is the same as used for Example 5 was used. Further, a length of time (c) between the time when the film was brought into contact with a solvent in the swelling bath and the time when the film was brought into contact with a first guide roll by conveyance was set to be 170 seconds. An arbitrary point on the film was impregnated in the swelling bath for 173 seconds in total.

Comparative Example 1

A polarizing film and a polarizing plate were formed in the same manner as in Example 1. However, in this example, in a swelling treatment, a length of time (a) between the time when a film was brought into contact with a solvent in a swelling bath and the time when the film was brought into contact with a first guide roll by conveyance was set to be 14 seconds, and a length of time (b) between the time when the film was brought into contact with the first guide roll and the time when the film was brought into contact with a second guide roll was set to be 75 seconds. An arbitrary point on the film was impregnated in the swelling bath for 94 seconds in total.

Comparative Example 2

A polarizing film and a polarizing plate were formed in the same manner as in Example 1. However, in this example, in a swelling treatment, a length of time (a) between the time when a film was brought into contact with a solvent in a swelling bath and the time when the film was brought into contact with a first guide roll by conveyance was set to be 0.3 seconds, and a length of time (b) between the time when the film was brought into contact with the first guide roll and the time when the film was brought into contact with a second guide roll was set to be 4 seconds. An arbitrary point on the film was impregnated in the swelling bath for 15 seconds in total.

Comparative Example 3

A polarizing film and a polarizing plate were formed in the same manner as in Example 4. However, in this example, in a swelling treatment, a length of time (c) between the time when a film was brought into contact with a solvent in a swelling bath and the time when the film was brought into contact with a first guide roll by conveyance was set to be 22 seconds. An arbitrary point on the film was impregnated in the swelling bath for 24 seconds in total.

Comparative Example 4

A polarizing film was formed in the same manner as in Example 4. However, in this example, a PVA film that is the same as used for Example 5 was used, a spiral roll was used as the guide roll (in the same manner as in Example 6), and swelling was performed at a temperature of 38° C. Further, with respect to the length of the raw film, a stretch ratio of stretching in a swelling bath was set to be 2.5 times, and a stretch ratio of stretching in a dyebath was set to be 3.2 times. Further, a length of time (c) between the time when the film was brought into contact with a solvent in the swelling bath and the time when the film was brought into contact with a first guide roll was set to be 188 seconds. An arbitrary point on the film was impregnated in the swelling bath for 191 seconds in total. However, in Comparative Example 4, because of a poor running property of the film, a polarizing film could not be produced.

Comparative Example 5

A polarizing film and a polarizing plate were formed in the same manner as in Example 1. However, in this example, a PVA film that is the same as used for Example 5 was used, and the temperature of a swelling bath was set to be 32° C. Further, with respect to the length of a raw film, a stretch ratio of stretching in the swelling bath was set to be 2.8 times, and a stretch ratio of stretching in a dyebath was set to be 3.5 times. Further, a length of time (a) between the time when a film is brought into contact with a solvent in the swelling film and the time when the film is brought into contact with a first guide roll by conveyance was set to be 15 seconds, and a length of time (b) between the time when the film is brought into contact with the first guide roll and the time when the film is brought into contact with a second guide roll was set to be 5 seconds. An arbitrary point on the film was impregnated in the swelling bath for 21 seconds in total.

(Method of Evaluating Display Unevenness)

Each of the polarizing plates obtained in Examples 1 to 9 and Comparative Examples 1 to 3 and 5 was cut into a square of 25 cm in length and 20 cm in width, and a resultant polarizing plate was attached to a surface (on a light source side) of a high-contrast type IPS liquid crystal cell using a pressure-sensitive adhesive. Further, trade name SEG1425DU (produced by Nitto Denko Corporation) was attached to the other surface (on a viewing side) of the liquid crystal cell. A resultant liquid crystal panel was placed on each of various backlights (A to D) that will be described later so that the polarizing plate at the light source side (the polarizing plate formed as described above) points downward. On the viewing side of the liquid crystal panel, observation was performed from a front direction and oblique directions (30°, 45°, 60°), and unevenness that was observed in black display was evaluated based on the following evaluation criteria. According to the following evaluation criteria, each polarizing plate can be considered as attaining an excellent effect if rated as 7 to 6, as practically usable if rated as 5 to 3, and as practically unusable if rated as 2 to 1.

(Evaluation Criteria)
- 7: No unevenness is observed.
- 6: Slight unevenness is observed in a darkroom, while no unevenness is observed in fluorescent lighting.
- 5: Unevenness is observed in a darkroom, while no unevenness is observed in fluorescent lighting.
- 4: Unevenness is observed clearly in a darkroom, while no unevenness is observed in fluorescent lighting.
- 3: Slight unevenness is observed in fluorescent lighting.
- 2: Unevenness is observed in fluorescent lighting.
- 1: Unevenness is observed clearly in fluorescent lighting.

(Backlight A)

Figure 9:
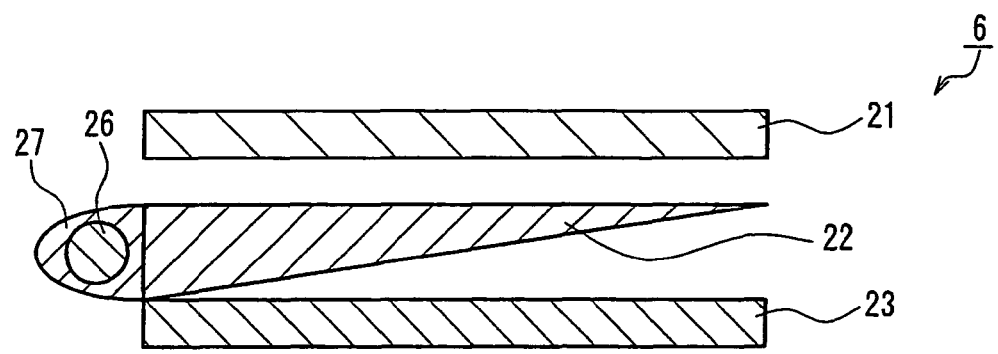
FIG. 9 is a cross-sectional view of an example of a backlight used in Examples of the present invention.

FIG. 9 is a cross-sectional view schematically showing a backlight A. As shown in the figure, in this backlight 6, a wedge-shaped light guide plate 22 with a printed rear surface was provided with a cold-cathode tube 26 and a lamp house 27, a diffusion plate 21 was disposed on an upper surface of the light guide plate 22, and a diffuse reflector plate 23 was disposed on a lower surface of the light guide plate 22.

(Backlight B)

Figure 10:
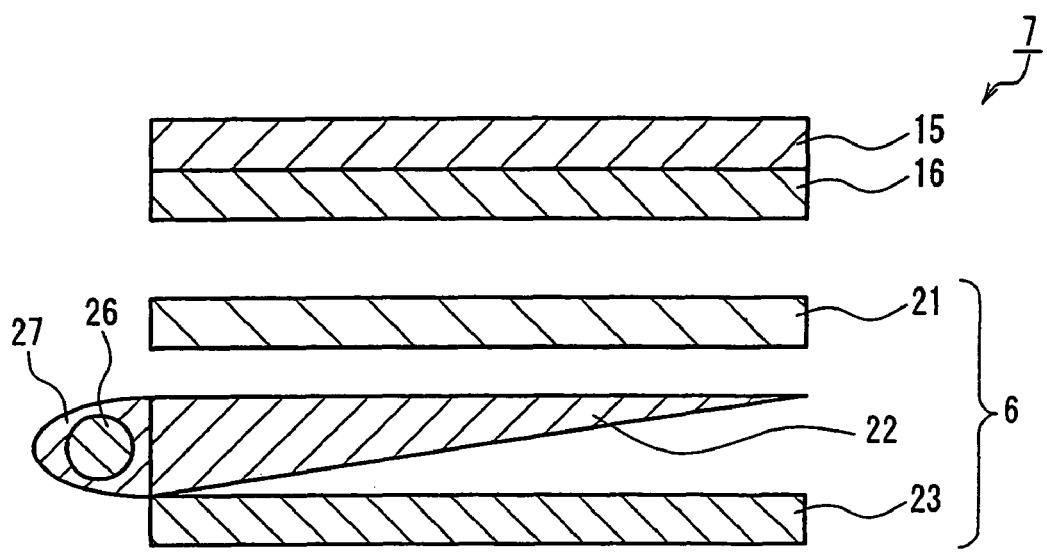
FIG. 10 is a cross-sectional view of another example of the backlight used in the Examples of the present invention.

FIG. 10 is a cross-sectional view schematically showing a backlight B. As shown in the figure, in this backlight 7, a laminate of a cholesteric layer and a λ/4 plate layer was disposed on the backlight 6 shown in FIG. 9. In this case, the laminate was disposed so that a cholesteric surface (16) was on a backlight 6 side and a λ/4 plate (15) was on a viewing side. When arranging a liquid crystal cell on the backlight 7 as described above, quantity of transmitted light was controlled so as to be maximum. As the laminate of the cholesteric layer and the λ/4 plate layer, trade name PCF400TEG produced by Nitto Denko Corporation without a polarization plate portion was used.

(Backlight C)

Figure 11:
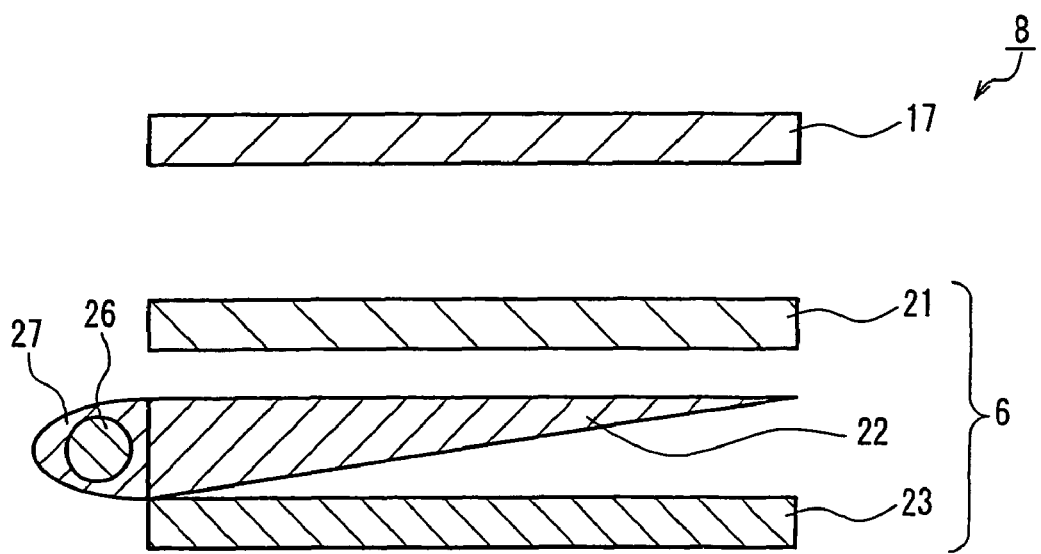
FIG. 11 is a cross-sectional view of still another example of the backlight used in the Examples.

FIG. 11 is a cross-sectional view schematically showing a backlight C. As shown in the figure, in this backlight 8, an anisotropic multiple thin-film reflective polarizer (trade name DBEF; produced by 3M Co.) 17 was disposed on the backlight 6 shown in FIG. 9. When arranging a liquid crystal cell on the backlight 8 as described above, quantity of transmitted light was controlled so as to be maximum.

(Backlight D)

Figure 12A:
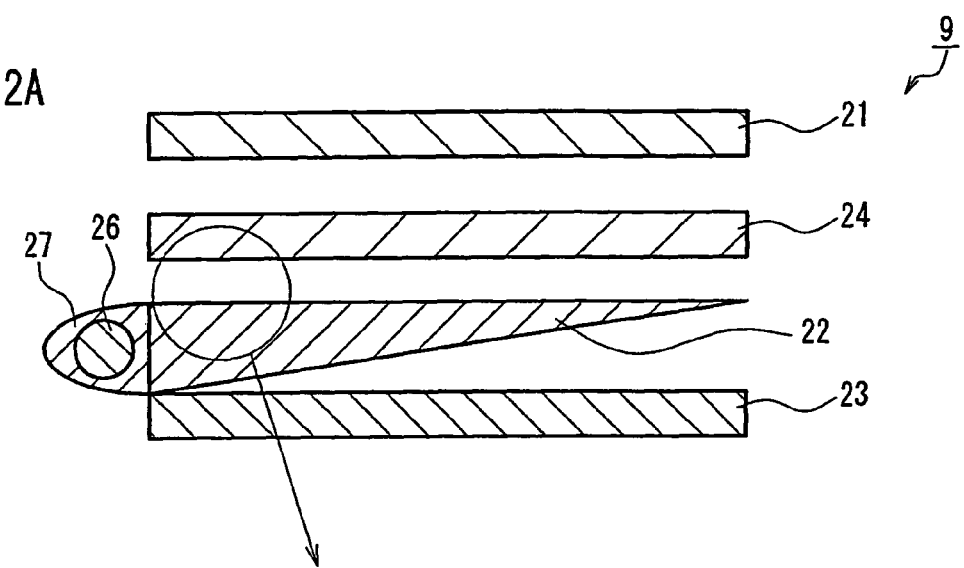
FIG. 12 shows in (A) a cross-sectional view of a yet still another example of the backlight used in the Examples, and (B) schematically shows a partial view of (A).
Figure 12B:
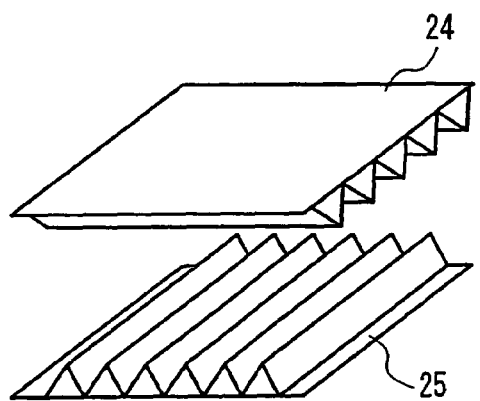

FIG. 12(A) is a cross-sectional view schematically showing a backlight D, and FIG. 12(B) schematically shows a partial view of FIG. 12(A). As shown in the figure, in this backlight 9, a wedge-shaped light guide plate 25 had a light-emitting surface on which a prism was formed, and was provided with a cold-cathode tube 26 and a lamp house 27, a diffuse reflector plate 23 was disposed on a lower surface of the light guide plate 25, and a prism sheet 24 was disposed on an upper surface of the light guide plate 25. As shown in FIG. 12(B) showing a partially enlarged view of FIG. 12(A), this prism sheet 24 was disposed so that its prism surface faced a prism surface of the light guide plate 25. A diffusion plate 21 further was disposed on an upper surface of the prism sheet 24.

TABLE 1

|  | Backlight A | | | | Backlight B | | | | Backlight C | | | | Backlight D | | | |
| --- | --- | --- | --- | --- | --- | --- | --- | --- | --- | --- | --- | --- | --- | --- | --- | --- |
|  | 0° | 30° | 45° | 60° | 0° | 30° | 45° | 60° | 0° | 30° | 45° | 60° | 0° | 30° | 45° | 60° |
| Ex. 1 | 7 | 7 | 7 | 7 | 7 | 7 | 7 | 7 | 7 | 7 | 7 | 7 | 7 | 7 | 7 | 6 |
| Ex. 2 | 7 | 7 | 7 | 6 | 7 | 7 | 6 | 5 | 7 | 7 | 6 | 6 | 7 | 7 | 6 | 6 |
| Ex. 3 | 7 | 7 | 6 | 6 | 7 | 6 | 6 | 5 | 7 | 6 | 5 | 5 | 7 | 7 | 6 | 5 |
| Ex. 4 | 7 | 7 | 7 | 7 | 7 | 7 | 7 | 7 | 7 | 7 | 7 | 7 | 7 | 7 | 6 | 6 |
| Ex. 5 | 7 | 7 | 7 | 7 | 7 | 7 | 7 | 7 | 7 | 7 | 7 | 7 | 7 | 7 | 7 | 7 |
| Ex. 6 | 6 | 6 | 6 | 5 | 6 | 5 | 4 | 4 | 6 | 5 | 4 | 4 | 6 | 6 | 5 | 5 |
| Ex. 7 | 7 | 7 | 7 | 7 | 7 | 7 | 6 | 6 | 7 | 7 | 6 | 6 | 7 | 7 | 7 | 6 |
| Ex. 8 | 7 | 7 | 6 | 6 | 7 | 7 | 6 | 5 | 7 | 7 | 6 | 6 | 7 | 7 | 6 | 6 |
| Ex. 9 | 7 | 7 | 7 | 7 | 7 | 7 | 7 | 6 | 7 | 7 | 7 | 6 | 7 | 7 | 6 | 6 |
| Com. Ex. 1 | 4 | 4 | 4 | 3 | 4 | 3 | 3 | 2 | 4 | 3 | 2 | 1 | 4 | 3 | 2 | 2 |
| Com. Ex. 2 | 3 | 3 | 3 | 2 | 3 | 2 | 1 | 1 | 3 | 1 | 1 | 1 | 3 | 3 | 2 | 2 |
| Com. Ex. 3 | 3 | 3 | 2 | 2 | 3 | 2 | 2 | 1 | 3 | 2 | 1 | 1 | 3 | 3 | 2 | 1 |

TABLE 1-continued

| | Backlight A | | | | Backlight B | | | | Backlight C | | | | Backlight D | | | |
|---|---|---|---|---|---|---|---|---|---|---|---|---|---|---|---|---|
| | 0° | 30° | 45° | 60° | 0° | 30° | 45° | 60° | 0° | 30° | 45° | 60° | 0° | 30° | 45° | 60° |
| Com. Ex. 4 | — | — | — | — | — | — | — | — | — | — | — | — | — | — | — | — |
| Com. Ex. 5 | 3 | 2 | 2 | 1 | 2 | 1 | 1 | 1 | 2 | 1 | 1 | 1 | 3 | 2 | 1 | 1 |

As is apparent from Table 1, compared with the polarizing plates of Comparative Examples 1 to 3 and 5, the polarizing plates of Examples 1 to 9 exhibited an excellent effect that display unevenness when viewed from the front and obliquely was reduced. These results show that the production method according to the present invention allows an excellent polarizing film to be produced, and thus it is made possible to provide various image displays in which display unevenness is suppressed.

INDUSTRIAL APPLICABILITY

As described in the foregoing discussion, when a polarizer produced by the production method according to the present invention is used in a liquid crystal panel, a liquid crystal display or the like as an optical film such as a polarizing plate or the like, display unevenness can be eliminated, thereby achieving excellent display characteristics. Furthermore, according to the present invention, a polarizer, a polarizing plate or the like can be provided with markings by in-line measurement. Therefore, for example, off-line processes such as visual inspection immediately after performing chip-cutting of the polarizer, packaging and the like become unnecessary, allowing a total in-house production of attaching the polarizer to a liquid crystal display or an EL display. This achieves, for example, a cost reduction of the display, and makes it easier to control its production processes, thus providing great industrial significance.

The invention claimed is:

1. A method of producing a polarizing film, comprising the steps of:
    allowing a hydrophilic polymer film to swell wherein the polymer film is conveyed by means of a guide roll so as to be impregnated in an aqueous solvent in a swelling bath, wherein the aqueous solvent is water, and wherein a temperature of the swelling bath is in a range of from 15 to 50° C.;
    dyeing the polymer film using a dichroic substance; and stretching the polymer film,
    wherein the hydrophilic polymer film is a polyvinyl alcohol-based film containing (i) polyvinyl alcohol having an average degree of polymerization in the range of from 1,000 to 4,000 and a saponification degree in the range of from 98 to 100 mol %, and (ii) glycerine in an amount of from 5 to 15% by mass as an additive,
    wherein in the swelling step, at least a first guide roll and a second guide roll are arranged in the swelling bath, and when the polymer film is impregnated in and allowed to travel in the aqueous solvent, the polymer film is brought into contact with the first guide roll within a time up to when swelling of the polymer film occurs abruptly and further is brought into contact with the second guide roll after the swelling of the polymer film has occurred abruptly,
    wherein a required length of time (a) between the time when the polymer film is brought into contact with the aqueous solvent and the time when the polymer film is brought into contact with the first guide roll is 2 to 11 seconds,
    wherein a required length of time (b) between the time when the polymer film is brought into contact with the first guide roll and the time when the polymer film is brought into contact with the second guide roll is 13 to 120 seconds, and
    wherein an arbitrary point on the film is impregnated in the swelling bath for a total length of time of from 63 to 130 seconds, and
    wherein a length of time between the time when the polymer film is brought into contact with the aqueous solvent and a time when swelling of the polymer film occurs abruptly is 15 to 25 seconds.

2. The method according to claim 1,
    wherein a length of time in which the polymer film is impregnated in the swelling bath is not less than 100 seconds.

3. The method according to claim 1,
    wherein the hydrophilic polymer film before being subjected to a swelling treatment has a thickness in a range of not more than 110 μm.

4. The method according to claim 1,
    wherein at least one of the first and second guide rolls is selected from a crown roll, a bent roll, and a roll with lugs.

5. The method according to claim 1,
    wherein a guide roll other than the first guide roll comprises a spiral roll.

6. The method according to claim 1,
    wherein in the swelling step, the polymer film is subjected to a further stretching treatment in the swelling bath.

7. The method according to claim 1,
    wherein with respect to a length of the polymer film before being subjected to the swelling step, a stretch ratio of the polymer film in the stretching treatment is in a range of 1.5 to 4.0 times.

8. The method according to claim 1,
    wherein the dichroic substance is at least one of iodine and organic dyestuffs.

9. The method according to claim 8,
    wherein the dichroic substance comprises at least two of the organic dyestuffs.

10. The method according to claim 1,
    wherein aqueous solvent in the swelling bath is water,
    wherein the dyeing step is conducted in a dyeing bath containing dichroic substance and potassium iodide, and
    wherein the stretching step is conducted in a stretching bath containing boric acid.

11. The method according to claim 1, wherein a temperature of the swelling bath is in a range of from 15 to 50° C., and a stretch ratio of the polymer film in the swelling bath is from 1.5 to 4.0 times.

12. The method according to claim 11, wherein the required length of time (a) is from 2.5 to 7 seconds, and the required length of time (b) is from 33 to 120 seconds.

13. The method according to claim 1, wherein the required length of time (a) is from 2 to 11 seconds, and the required length of time (b) is from 35 to 110 seconds.

14. The method according to claim 1, wherein the swelling bath is water.

* * * * *